(12) United States Patent
Asano et al.

(10) Patent No.: US 11,190,159 B2
(45) Date of Patent: Nov. 30, 2021

(54) NOISE FILTER

(71) Applicant: TOKIN Corporation, Sendai (JP)

(72) Inventors: Honoka Asano, Sendai (JP); Shu Sato, Sendai (JP); Yuta Nakano, Sendai (JP)

(73) Assignee: TOKIN Corporation, Sendai (JP)

(*) Notice: Subject to any disclaimer, the term of this patent is extended or adjusted under 35 U.S.C. 154(b) by 91 days.

(21) Appl. No.: 16/595,329

(22) Filed: Oct. 7, 2019

(65) Prior Publication Data

US 2021/0104994 A1    Apr. 8, 2021

(51) Int. Cl.

| H03H 7/01 | (2006.01) |
|---|---|
| H01F 27/24 | (2006.01) |
| H01F 27/02 | (2006.01) |
| H03H 1/00 | (2006.01) |
| H01G 2/10 | (2006.01) |
| H01F 27/29 | (2006.01) |
| H01F 27/28 | (2006.01) |

(52) U.S. Cl.
CPC .......... *H03H 7/0115* (2013.01); *H01F 27/02* (2013.01); *H01F 27/24* (2013.01); *H01F 27/2823* (2013.01); *H01F 27/29* (2013.01); *H01G 2/106* (2013.01); *H03H 1/00* (2013.01); *H03H 1/0007* (2013.01); *H03H 2001/005* (2013.01)

(58) Field of Classification Search
CPC ....... H01F 27/02; H01F 27/24; H03H 1/0007; H03H 7/0115
USPC ................................................. 333/181, 185
See application file for complete search history.

(56) References Cited

U.S. PATENT DOCUMENTS 5,580,280 A * 12/1996 Minich .............. H01R 13/6625
439/620.22

FOREIGN PATENT DOCUMENTS

| JP | H0546315 Y2 | 12/1993 |
|---|---|---|
| JP | 2551775 Y2 | 6/1997 |
| JP | 5101987 B2 | 10/2012 |
| JP | 2015170626 A | 9/2015 |

OTHER PUBLICATIONS

Japanese Patent Office, Office Action Issued in Application No. 2018-079307, Jun. 29, 2021, 6 pages. (Submitted with English Translation).

* cited by examiner

*Primary Examiner* — Rakesh B Patel
(74) *Attorney, Agent, or Firm* — McCoy Russell LLP

(57) ABSTRACT

A noise filter includes a metallic bottom plate, a case main body integrally formed with a terminal strip and attached to the bottom plate, and a capacitor including a terminal configured to be connected in the terminal strip. The noise filter further includes a capacitor housing part formed inside the terminal strip in the case main body, the capacitor housing part being configured to house the capacitor, and an inductor disposed on a top surface side of the case main body, the inductor comprising a terminal configured to be connected in the terminal strip. The capacitor housing part houses the capacitor, in a state where the capacitor is inclined with respect to the bottom plate, so that a lead part of the terminal of the capacitor is positioned on an upper end side of the capacitor in an inclination direction.

16 Claims, 15 Drawing Sheets

NOISE FILTER

TECHNICAL FIELD

The present disclosure relates to a noise filter.

BACKGROUND

Regarding apparatuses such as industrial apparatuses and domestic electrical appliances, there are apparatuses which are equipped with a noise filter for removing noises that would otherwise enter through a power line or the like. For example, Japanese Patent No. 5101987 discloses a noise filter in which a terminal strip part and a molded case part are integrally formed and a capacitor is vertically disposed inside the terminal strip part. The noise filter disclosed in Japanese Patent No. 5101987 can be easily assembled because of the above-described arrangement of the capacitor.

Further, Japanese Examined Utility Model Application Publication No. H05-046315 discloses a noise filter including a choke coil which is disposed on an insulating sheet disposed along a bottom plate part of a box-shaped metal case main body in a proximate manner and fixed by resin casting. Further, Japanese Utility Model No. 2551775 discloses a noise filter including a resin base, a metallic ground plate engaged therewith, and a coil, in which an insulating plate is disposed on the metallic ground plate and a space between the insulating plate and the coil is filled with a cast resin.

SUMMARY

Incidentally, the above-described apparatuses have been downsized year by year and the noise filters mounted thereon are also often required to be downsized. Noise filters are often required to be downsized as described above. However, since they also need to have characteristics equivalent to or better than those of existing noise filters, it is necessary to further reduce their external size while maintaining their characteristics at a level equivalent to those of the existing noise filters.

However, since some space for carrying out assembling work including soldering performed within a predetermined size is secured in the noise filter disclosed in Japanese Patent No. 5101987, there are many dead spaces in the noise filter. Therefore, there is room for reducing at least the height of the noise filter.

Further, there is plenty of room for reducing the size of the noise filter disclosed in Japanese Examined Utility Model Application Publication No. H05-046315 because the capacitor is disposed above the choke coil. Further, there is also plenty of room for reducing the size of the noise filter disclosed in Japanese Utility Model No. 2551775 because the capacitor is not disposed inside the terminal strip.

Further, if the external size of a noise filter is simply reduced, the following problems arise, i.e., a problem that an insulation distance in a part where insulation is necessary is insufficient as compared to that of the noise filter whose size is not reduced and a problem that the characteristics of the noise filter deteriorate. Note that the characteristics of the noise filter may deteriorate not only due to the insufficient insulation distance but also due to other factors. Therefore, in order to reduce the size of the noise filter, it is necessary, for example, to maintain the insulation distance in the part where insulation is necessary, and maintain or improve the characteristics of the noise filter. That is, it is necessary to downsize the external size of the noise filter without deteriorating or while improving the characteristics of the noise filter.

The present disclosure has been made in view of the above-described circumstances and an object thereof is to provide a noise filter capable of improving its characteristics in order to downsize its external size.

An exemplary aspect is a noise filter including: a metallic bottom plate; a case main body integrally formed with a terminal strip and attached to the bottom plate; a capacitor including a terminal configured to be connected in the terminal strip; a capacitor housing part formed inside the terminal strip in the case main body, the capacitor housing part being configured to house the capacitor; and an inductor disposed on a top surface side of the case main body, the inductor including a terminal configured to be connected in the terminal strip, in which the capacitor housing part houses the capacitor in a state where the capacitor is inclined with respect to the bottom plate so that a lead part of the terminal of the capacitor is positioned on an upper end side of the capacitor in an inclination direction.

Further, the capacitor housing part may have such a shape that the capacitor can be insertion-fitted into the capacitor housing part in a direction oblique to the bottom plate in a state where the bottom plate is attached and the inductor is not disposed.

Further, the capacitor housing part may include an inclined part configured to guide a top surface of the capacitor located on a side extending along an insertion-fitting direction when the capacitor is insertion-fitted.

Further, the capacitor housing part may house the capacitor in a state where the capacitor is in contact with a part of the inclined part.

Further, the capacitor housing part may include a pressing part configured to press a bottom surface of the capacitor located on a side extending along the inclination direction in a state where the capacitor is housed in the capacitor housing part.

Further, the capacitor may include an exterior case made of resin.

Further, the capacitor may be an X-capacitor.

Further, the terminal strip may include, as the capacitor, an input terminal strip and an output terminal strip, and the noise filter may further include an input-side capacitor configured to be connected in the input terminal strip and an output-side capacitor configured to be connected in the output terminal strip.

Further, the bottom plate may include a pair of attaching parts configured to attach the noise filter, the pair of attaching parts being arranged on one diagonal line.

Further, the inductor may include a core case configured to house a core, the core case being configured so that an electric wire is wound around the core case, and the core case may include a positioning part configured to position the inductor with respect to the case main body.

Further, the case main body may include a case-side positioning part having a shape by which the case-side positioning part is engaged with the positioning part, and the positioning part may position, as it is engaged with the case-side positioning part, a release position with respect to the terminal strip, the release position being a position at which the wound electric wire is separated from the core case.

Further, the positioning part may position the inductor with respect to the bottom plate in a height direction.

Further, the bottom plate may be a ferromagnet.

Further, the bottom plate may be a non-magnetic conductor.

Further, the noise filter may further include: a Y-capacitor of which one of terminals is connected to the bottom plate and the other terminal is connected to the terminal strip; and a case cover attached to the case main body so as to cover at least the inductor, in which the case main body may include a cut-out part on a part of a side surface thereof, the cut-out part being configured to form a work space that is used when the Y-capacitor is attached in a state where the case cover is removed.

Another exemplary aspect is a noise filter including: a metallic bottom plate; a case main body integrally formed with a terminal strip and attached to the bottom plate; and an inductor disposed on a top surface side of the case main body, the inductor including a terminal configured to be connected in the terminal strip, in which the inductor includes a core case configured to house a core, the core case being configured so that an electric wire is wound around the core case, the core case includes a positioning part configured to position the inductor with respect to the case main body, the case main body includes a case-side positioning part having a shape by which the case-side positioning part is engaged with the positioning part, and the positioning part positions, as it is engaged with the case-side positioning part, a release position with respect to the terminal strip and positions the inductor with respect to the bottom plate in a height direction, the release position being a position at which the wound electric wire is separated from the core case.

According to the present disclosure, it is possible to provide a noise filter capable of improving its characteristics in order to downsize its external size.

The above and other objects, features and advantages of the present disclosure will become more fully understood from the detailed description given hereinbelow and the accompanying drawings which are given by way of illustration only, and thus are not to be considered as limiting the present disclosure.

DETAILED DESCRIPTION

Embodiments are described hereinafter with reference to the drawings. Note that the same symbols are assigned to the same components throughout the drawings and their duplicated descriptions are omitted as appropriate.

EMBODIMENTS

An example of a structure of a noise filter according to an embodiment of the present disclosure is described with reference to FIGS. 1 to 12E. A noise filter according to this embodiment is provided in, for example, an apparatus such as an industrial apparatus or a domestic electrical appliance and removes noises that would otherwise enter through a power line or the like. The following description is given on the assumption that the noise filter according to this embodiment is a noise filter for a single-phase AC (Alternating Current). However, the noise filter according to this embodiment may be other types of noise filters such as a noise filter for a three-phase AC.

Figure 1:
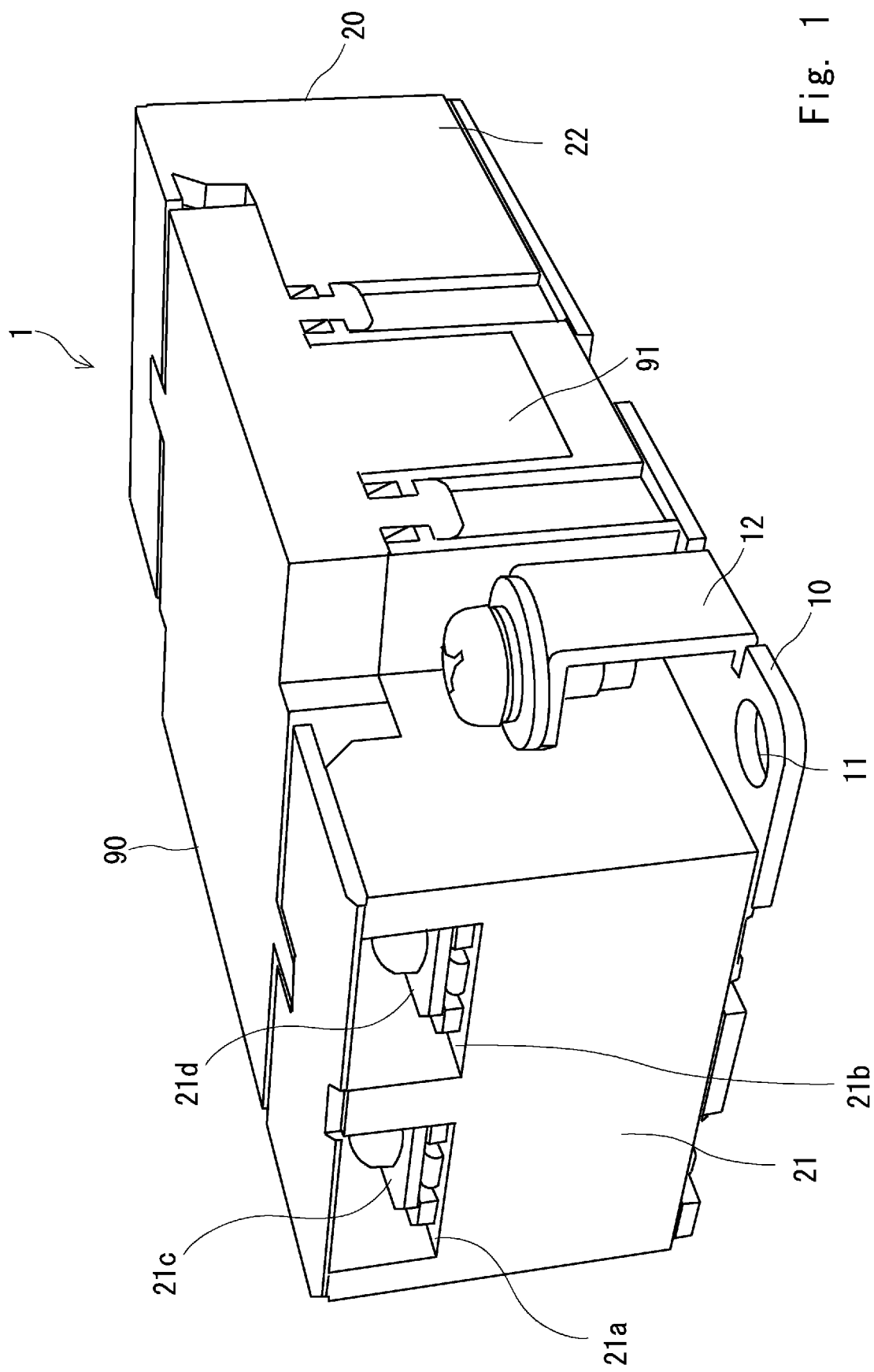
FIG. 1 is a perspective view showing an external appearance of an example of a structure of a noise filter according to an embodiment of the present disclosure.
Figure 2:
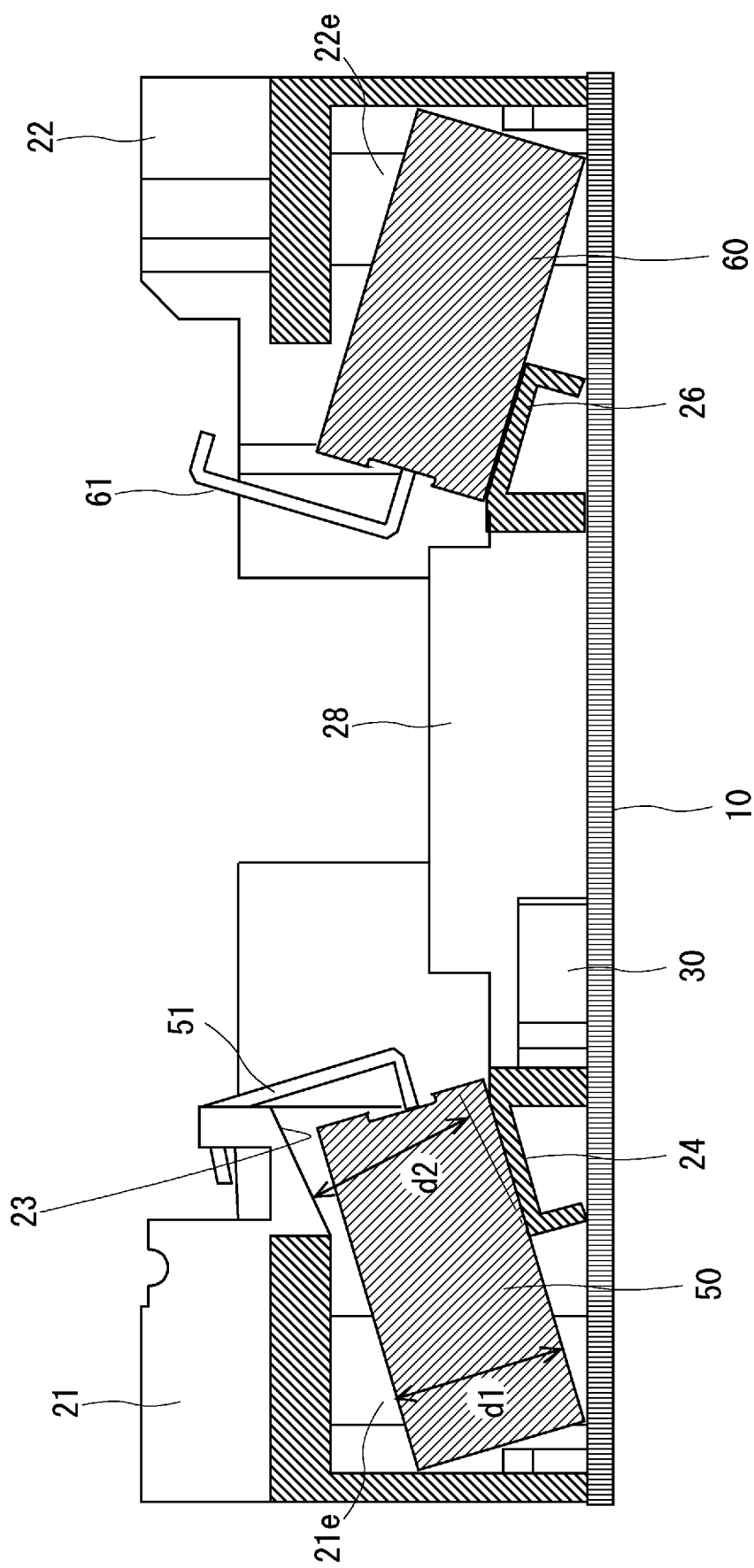
FIG. 2 is a schematic cross section showing a state in which a top cover (upper lid) and an inductor are removed from the noise filter shown in FIG. 1.
Figure 3:
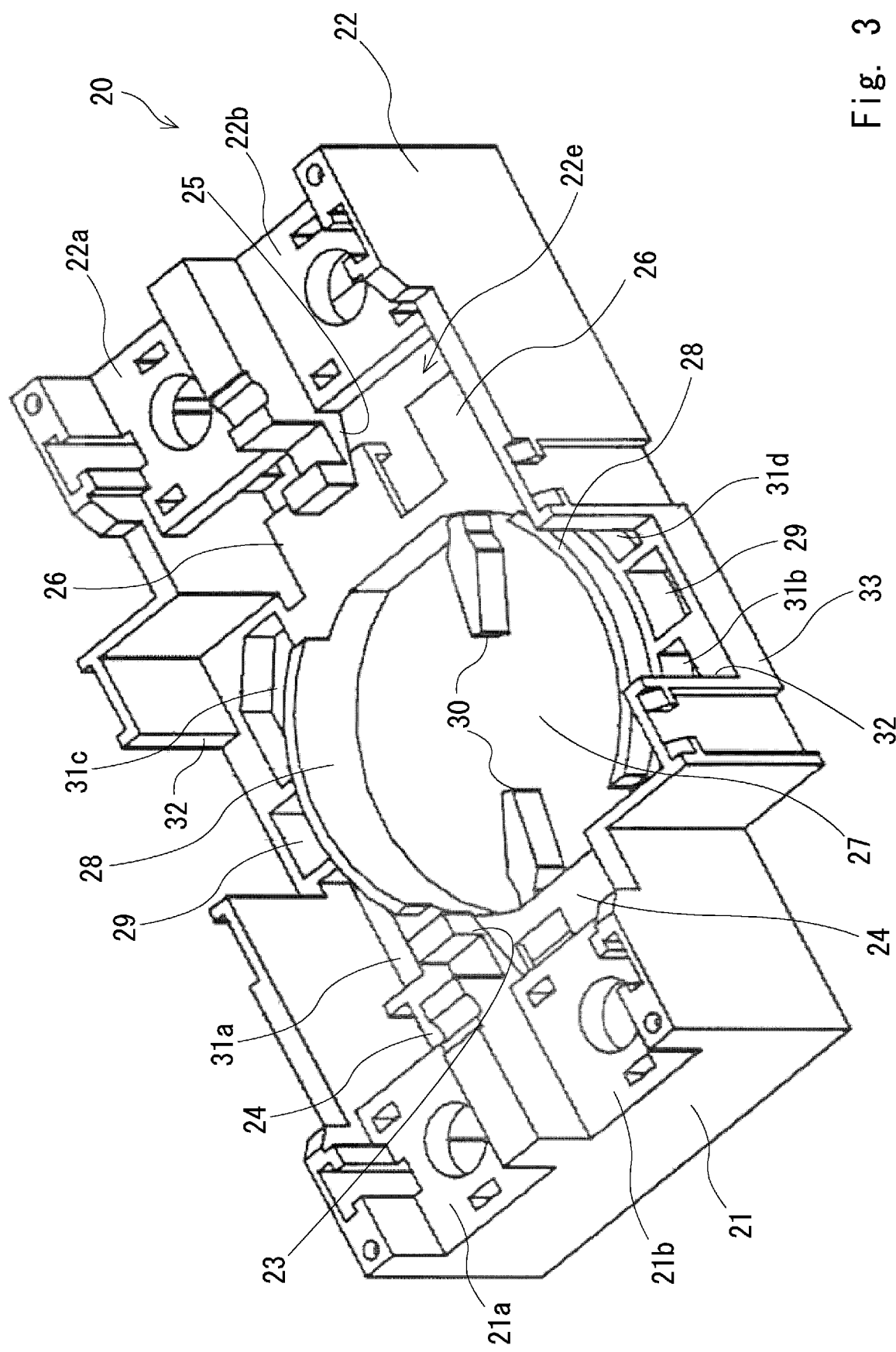
FIG. 3 is a perspective view showing an example of a structure of a case main body of the noise filter shown in FIG. 1.
Figure 4:
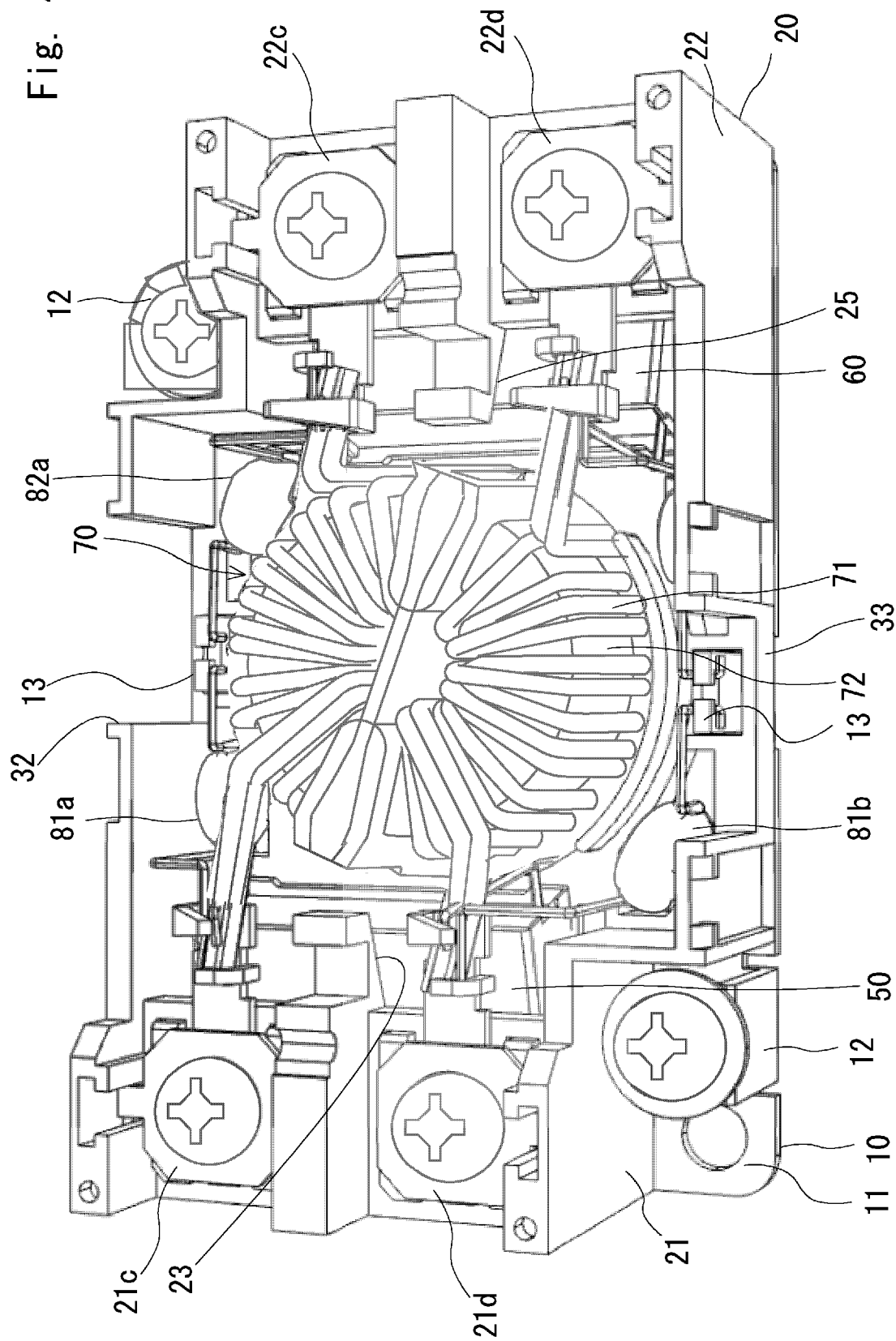
FIG. 4 is a schematic perspective view showing a state in which X-capacitors, an inductor, and Y-capacitors are disposed in the case main body shown in FIG. 3.
Figure 5:
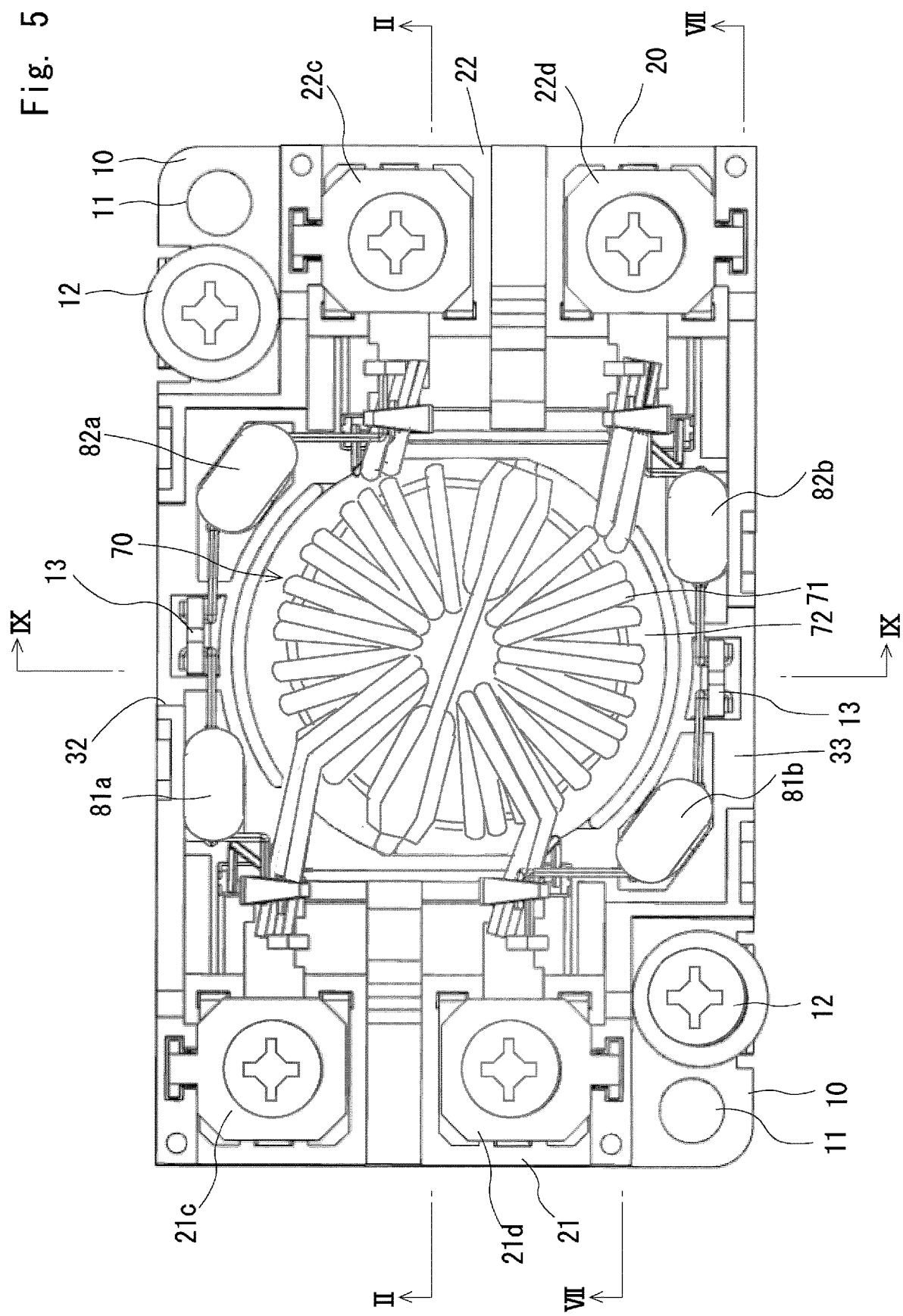
FIG. 5 is a top view showing a state in which X-capacitors, an inductor, and Y-capacitors are disposed in the case main body shown in FIG. 3.

FIG. 1 is a perspective view showing an external appearance of an example of a structure of a noise filter according to this embodiment. FIG. 2 is a schematic cross section showing a state in which an upper lid (a case cover) and an inductor are removed from the noise filter shown in FIG. 1, and is a cross section showing an example of an insulating structure of a capacitor. FIG. 3 is a perspective view showing an example of a structure of a case main body of the noise filter shown in FIG. 1. FIG. 4 is a schematic perspective view showing a state in which X-capacitors, an inductor, and Y-capacitors are disposed in the case main body shown in FIG. 3. Further, FIG. 5 is its top view.

As shown in FIG. 1, a noise filter 1 according to this embodiment includes a metallic bottom plate 10 and a case main body 20 which is integrally formed with terminal strips 21 and 22, and attached to the metallic bottom plate 10.

Further, as shown in FIG. 2, the noise filter 1 according to this embodiment includes X-capacitors 50 and 60, and capacitor housing parts 21e and 22e disposed in the terminal strips 21 and 22, respectively. The X-capacitors 50 and 60 are across-the-line-capacitors and are capacitors that are inserted between phases. The X-capacitor 50 is an X-capacitor inserted on an input side and the X-capacitor 60 is an X-capacitor inserted on an output side. Both of them are provided in order to mainly remove normal-mode noises. Note that FIG. 2 corresponds to cross section as viewed from in a II-II direction in FIG. 5. Note that a later-described inductor, Y-capacitors, etc. are omitted in FIG. 2.

Further, as shown in FIG. 1, the noise filter 1 may include a case cover 90 and also include an upper lid disposed above the terminal strips 21 and 22. The case of the noise filter 1 may be formed by the case main body 20, the case cover 90, and so on. Further, the case may be made of resin or the like for an insulation purpose. The case cover 90 is attached on a top surface side of the case main body 20 so as to cover at least a later-described inductor 70 (see FIGS. 4 and 5). The case cover 90 preferably has a shape by which it is engaged with the case main body 20.

The terminal strips 21 and 22, which are integrally formed with the case main body 20, may serve as terminal strips on an input side and an output side, respectively. That is, they may serve as an input terminal strip and an output terminal strip, respectively. The terminal strip 21 may include, in its upper part, connection strips 21a and 21b to which the respective terminals of the X-capacitor 50 or the like are connected. Metal terminals (hereinafter referred to as metal plates) 21c and 21d for connecting with the respective terminals are disposed in the connection strips 21a and 21b. The same applies to the terminal strip 22. Further, as shown in FIGS. 3 to 5, the terminal strip 22 may include connection strips 22a and 22b in which metal plates 22c and 22d are respectively disposed.

The capacitor housing part 21e on the terminal strip 21 side is formed inside the terminal strip 21 of the case main body 20 (in an internal space below the connection strips 21a and 21b) and houses the X-capacitor 50 inserted on the input side. Note that FIG. 2 shows an example in which the X-capacitor 50 is housed in the capacitor housing part 21e in a state in which the lowermost part of the X-capacitor 50 is in contact with the bottom plate 10. However, the X-capacitor 50 may not be in contact with the bottom plate 10 as long as the position of the X-capacitor 50 can be maintained. For example, the position of the X-capacitor 50 can be maintained by disposing it so that it is in contact with an inner side of a side wall of the capacitor housing part 21e.

Similarly, the capacitor housing part 22e on the terminal strip 22 side is formed inside the terminal strip 22 of the case main body 20 (in an internal space below the connection strips 22a and 22b) and houses the X-capacitor 60 inserted on the output side.

The X-capacitor 50 includes a pair of terminals 51 led out from (i.e., extending from) its main body. The two terminals 51 constituting the above pair are electrically connected to the metal plates 21c and 21d, respectively, of the terminal strip 21 in a state in which the main body of the X-capacitor 50 is housed in the capacitor housing part 21e. This means that external lead wires for supplying AC power are electrically connected to the respective metal plates 21c and 21d. Further, although not shown in the drawings, discharging resistors can be connected to the pair of terminals 51 of the X-capacitor 50.

The X-capacitor 60 includes a pair of terminals 61 led out from (i.e., extending from) its main body. The two terminals 61 constituting the above pair are electrically connected to the metal plates 22c and 22d, respectively, of the terminal strip 22 in a state in which the main body of the X-capacitor 60 is housed in the capacitor housing part 22e. This means that external lead wires for outputting AC power are electrically connected to the respective metal plates 22c and 22d.

Further, although not shown in the drawings, discharging resistors can be connected to the pair of terminals 61 of the X-capacitor 60.

Note that although the descriptions are given on the assumption that the noise filter 1 includes the X-capacitors 50 and 60, the noise filter according to this embodiment is not limited such noise filters and may be one including an X-capacitor on one of the input side and the output side. In that case, the capacitor housing part may be provided only for the one of the above-described X-capacitors. Further, the capacitors housed in the capacitor housing parts 21e and 22e formed inside the terminal strips 21 and 22 are not limited to the X-capacitors.

Further, as shown in FIGS. 4 and 5, the noise filter 1 includes the inductor 70. The inductor 70 is provided in order to mainly remove common-mode noises. The inductor 70 includes a winding 71 and an end of the winding 71 on the input side is electrically connected to the metal plates 21c and 21d of the terminal strip 21. Further, an end of the winding 71 on the output side is electrically connected to the metal plates 22c and 22d of the terminal strip 22. The inductor 70 is disposed between the terminal strips 21 and 22 on the top surface side of the case main body 20, i.e., disposed in an area on the top surface side that is not occupied by the terminal strips. The inductor 70 may be, for example, a choke coil as shown in the example. However, the inductor 70 is not limited to the choke coil.

Next, the capacitor housing part 21e on the input side, which is one of the main features of this embodiment, is described in detail. Note that the capacitor housing part 22e on the output side is basically similar to the capacitor housing part 21e on the input side except that the object to be housed therein is the X-capacitor 60. Therefore, only the capacitor housing part 21e on the input side is described hereinafter.

The capacitor housing part 21e on the input side houses the X-capacitor 50 in a state where the X-capacitor 50 is inclined with respect to the bottom plate 10 so that the lead-out part of the terminal 51 of the X-capacitor 50 is positioned on an upper end side of the X-capacitor 50 in the inclination direction. Note that the upper end side in the inclination direction means one of both ends in the inclination direction that is located on the upper side. Needless to say, the upper end side differs from one of the ends in a direction roughly perpendicular to the inclination direction that is located on the side from which the terminal 51 is led out.

In other words, the capacitor housing part 21e houses the X-capacitor 50 in a state where the X-capacitor 50 is inclined in an oblique direction with respect to the bottom plate 10. Further, if the X-capacitor 50 is housed in an inclined manner so that the terminal 51 of the X-capacitor 50 is close to the bottom plate 10, they cannot be insulated from each other. Therefore, the X-capacitor 50 is housed in an inclined manner so that the terminal 51 side is distant from the bottom plate 10.

As described above, the X-capacitor 50 is horizontally disposed in an inclined manner and housed in the space below the terminal strip 21, so that it is possible to reduce the dead space that would otherwise not be used and thereby to downsize the noise filter 1 (especially, in the height). Further, as described above, the X-capacitor 50 is housed in an inclined manner so that the end thereof on the side from which the terminal 51 is led out is positioned higher than the end thereof on the side from which no terminal is led out, so that the insulation distance between the metallic bottom plate 10 and the terminal 51 can be secured. Therefore, the above-described way of housing makes it possible to downsize the noise filter and secure the insulation distance at the same time. That is, it is possible to improve the characteristics of the noise filter, such as an attenuation characteristic and a dielectric strength of the noise filter, and also improve the safety. Further, since the X-capacitor 50 is obliquely inserted, the workability for the attachment can be improved, thus making it possible to facilitate the assembling. Note that the terminal 51 of the X-capacitor 50 may be bent, for example, substantially at a right angle with respect to the lead-out part as shown in FIG. 2. However, the way of bending is not limited to this example as long as the terminal 51 is not bent downward.

As described above, the external size of the noise filter 1 according to this embodiment can be reduced (the height can be reduced). Further, the characteristics of the noise filter, which are required to downsize the noise filter, can be improved.

Further, as shown in FIG. 2, the capacitor housing part 21e on the input side preferably has such a shape that the X-capacitor 50 can be insertion-fitted, from a place on the side on which the inductor 70 is disposed, into the capacitor housing part 21e in a direction oblique to the bottom plate 10 in a state where the bottom plate 10 is attached and the inductor 70 is not disposed. In this way, the X-capacitor 50 can be easily mounted when the noise filter 1 is manufactured. Further, the X-capacitor 50 can be fixed after the X-capacitor 50 is mounted.

Further, each of the X-capacitors 50 and 60 preferably includes an exterior case made of resin such as plastic. In this way, it is possible to give rigidity to the X-capacitors 50 and 60 to such an extent that they can be insertion-fitted without being damaged. In particular, each of the X-capacitors 50 and 60 preferably includes an exterior case having a roughly rectangular-parallelepiped shape, so that the shapes of the capacitor housing parts 21e and 22e can be simplified.

Further, the capacitor housing part 21e preferably includes an inclined part (an inclined structure) 23 configured to guide the top surface of the X-capacitor 50 located on a side extending along the insertion-fitting direction when the X-capacitor 50 is insertion-fitted. In this way, the X-capacitor 50 can be easily mounted when the noise filter 1 is manufactured. Note that as shown in FIG. 3, the X-capacitor 60 may include a similar inclined part 25.

Further, the capacitor housing part 21e preferably houses the X-capacitor 50 in a state where the X-capacitor 50 is in contact with a part of the inclined part 23. In particular, the above-described way of housing can be realized by configuring the inclined part 23, which corresponds to the entrance of the capacitor housing part 21e, so that a thickness d2 thereof in a direction perpendicular to the inclined part 23 is equal to or slightly smaller than a thickness d1 of the X-capacitor 50. In the above-described structure, it is possible to fix the X-capacitor 50 in a satisfactory manner when the X-capacitor 50 is housed.

The capacitor housing part 21e preferably includes a pressing part 24 that presses the bottom surface of the X-capacitor 50 located on a side extending along the inclination direction (e.g., the bottom surface on the side extending along the insertion-fitting direction at the time of the insertion-fitting) in a state where the X-capacitor 50 is housed in the capacitor housing part 21e. Note that the pressing part 24 needs only to press the X-capacitor 50 after the completion of the housing process. However, in actuality, the X-capacitor 50 is also pressed during the insertion-fitting process. Further, the pressing part 24 may has any shape as long as it has sufficient elasticity to hold the X-capacitor 50. For example, the pressing part 24 may be formed as a claw part like the one shown in FIG. 2. Note that the pressing part of the capacitor housing part 22e is shown as a pressing part 26 in the drawing. Further, a plurality of pressing parts 26, e.g., two pressing parts 26 can be disposed at different places depending on the material, the shape, and the like of the pressing part 26 as shown in FIG. 3. The same applies to the pressing part 24.

By being equipped with the above-described pressing part 24, it is possible to press and hold the X-capacitor 50 when the X-capacitor 50 is housed. In particular, it is considered that a tip of the pressing part 24 (a tip of the claw part) is preferably brought into contact with the bottom plate 10 when the X-capacitor 50 is housed as shown in FIG. 2 in order to fix the position of the X-capacitor 50. It should be noted that the position of the X-capacitor 50 can be fixed when the X-capacitor 50 is in contact with the capacitor housing part 21e or the bottom plate 10 at three different places. For example, in FIG. 2, the X-capacitor 50 is housed in the capacitor housing part 21e in a state where the X-capacitor 50 is in contact with the bottom plate 10 and with the inner side of the side wall of the capacitor housing part 21e. However, the X-capacitor 50 is preferably housed in a state where the X-capacitor 50 is also in contact with a lower end of the inclined part 23 in the inclination direction.

Further, the pressing part 24 can also have a function of ensuring insulation between the terminal (the lead wire) 51 of the X-capacitor 50 and the bottom plate 10. In particular, by adopting a structure in which the X-capacitor 50 slides over the pressing part 24, a resin part is interposed between the terminal 51 of the X-capacitor 50 and the metallic bottom plate 10, thus making it possible to secure the insulation distance therebetween. Further, in this embodiment, a tip of the pressing part 24 (a tip of the claw part) is formed in an L-shape so as to project toward the bottom plate 10, so that the minimum distance necessary for the insulation between the X-capacitor 50 and the bottom plate 10 can be secured without fail. However, the pressing part 24 is not limited to the above-described structure and may have any shape as long as the distance necessary for the insulation between the X-capacitor 50 and the bottom plate 10 can be secured. Further, the pressing part 24 does not necessary have to have the shape having the projecting tip.

Further, the noise filter 1 may include Y-capacitors 81a, 81b, 82a and 82b each of which includes one terminal connected to the bottom plate 10 and another terminal connected to a respective one of metal plates 21c, 21d, 22c and 22d of the terminal strips 21 and 22. Each of the Y-capacitors 81a, 81b, 82a and 82b is a line-bypass capacitor and is a capacitor inserted between a phase and a frame ground or the like. Further, they are provided in order to mainly attenuate common mode components in an effective manner.

The Y-capacitor 81a is connected between the metal plate 21c, which serves as an input terminal, and one of the ground terminals 13 of the bottom plate 10. The Y-capacitor 81b is connected between the metal plate 21d, which serves as an input terminal, and the other ground terminal 13 of the bottom plate 10. That is, each of the terminals (the lead wires) on the input sides of the Y-capacitors 81a and 81b is connected to an external lead wire in a respective one of the metal plates 21c and 21d disposed on the terminal strip 21. Further, the terminals (the lead wires) on the output sides are connected to the ground terminals 13.

The Y-capacitor 82a is connected between the metal plate 22c, which serves as an output terminal, and the aforementioned one of the ground terminals 13. The Y-capacitor 82b is connected between the metal plate 22d, which serves as an output terminal, and the aforementioned other ground terminal 13. That is, each of the terminals on the output sides of the Y-capacitors 82a and 82b is connected to an external lead wire in a respective one of the metal plates 22c and 22d disposed on the terminal strip 22. Further, the terminals on the input sides of the Y-capacitors 82a and 82b are connected to the ground terminals 13.

The Y-capacitors 81a, 81b, 82a and 82b are disposed in Y-capacitor housing parts (housing pockets) 31a, 31b, 31c and 31d, respectively, in the case main body 20. Regarding each of the Y-capacitors 81a, 81b, 82a and 82b, it is possible to improve the characteristics of the noise filter by shortening its terminal connected to the ground terminal 13. Therefore, it is desirable that these terminals be disposed in places that are close to the ground terminals 13 and to the bottom plate 10 side as much as possible.

Further, the case main body 20 may further include a ground terminal engaging part 29 which is formed as a hole having a shape by which it is engaged with the ground terminal 13. Note that the Y-capacitors 81a, 81b, 82a and 82b may not be provided depending on the circuit constant.

Further, there is a problem that as the external size of the noise filter is reduced, the workability of assembling work deteriorates. Therefore, it is also desired to prevent the workability from deteriorating. In this embodiment, the following structure is preferably adopted in order to improve the workability.

That is, the case main body 20 preferably includes, on a part of its side surface, a cut-out part 32 for forming a work space which is used when the Y-capacitors 81a, 81b, 82a and 82b are attached in a state where the case cover 90 is removed. The cut-out part 32 is a part that is formed by reducing the height of the side wall. By providing the cut-out part 32, the workability for attaching the Y-capacitors 81a, 81b, 82a and 82b (mainly, bundling of their lead wires and soldering them) can be improved as compared to the case where the side wall is formed with the constant height. Further, by improving the workability for attaching the Y-capacitors 81a, 81b, 82a and 82b, it becomes possible to dispose the Y-capacitors 81a, 81b, 82a and 82b in places close to the bottom plate 10 side as much as possible and to dispose the relevant terminals close to the ground terminals 13. As a result, the characteristics of the noise filter can be further improved. Further, by providing the cut-out part 32, the case main body 20 can be downsized as compared to the case where the overall size of the case main body 20 is increased to ensure the workability. The height of the cut-out part 32 is preferably reduced to such an extent that the above-described work is not hindered at all.

Further, the case cover 90 preferably includes a projection part 91 having a shape which conforms to the shape of cut-out part 32 and by which the cut-out part 32 is thereby closed when the case cover 90 attached to the noise filter 1, so that no large gap is formed between the case main body 20 of the noise filter 1 and the case cover 90.

Figure 6:
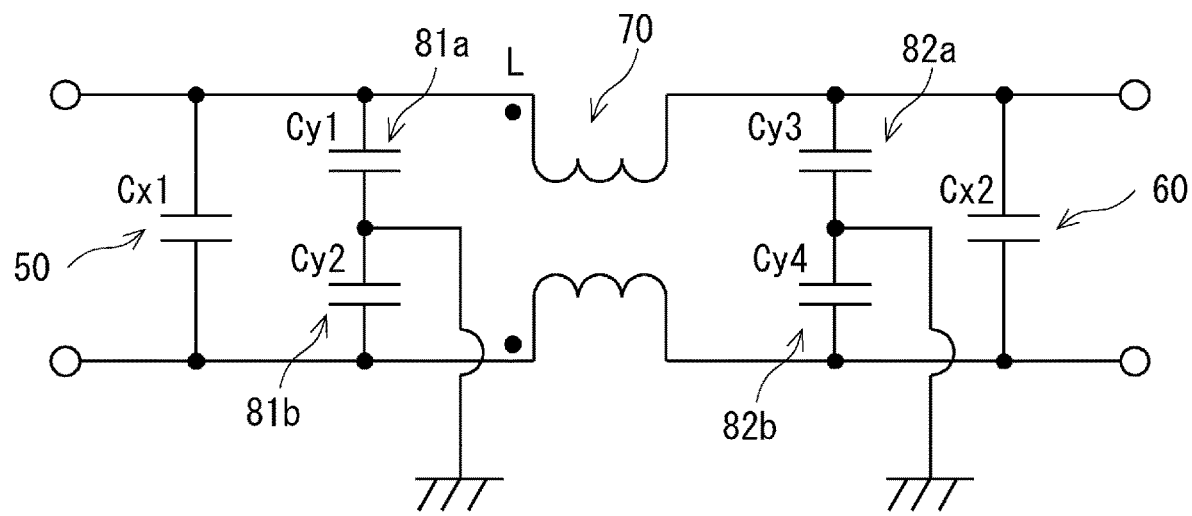
FIG. 6 is a circuit diagram of the noise filter including the X-capacitors, the inductor, and the Y-capacitors shown in FIG. 4.

A circuit configuration of the noise filter 1 is described hereinafter with reference to FIG. 6. FIG. 6 is a circuit diagram of the noise filter 1 including the X-capacitors 50 and 60, the inductor 70, and the Y-capacitors 81a, 81b, 82a and 82b shown in FIG. 4.

The noise filter 1 is a device in which L and C circuits are combined with each other for removing noises. Specifically, in the noise filter 1, X-capacitors Cx1 (50) and Cx2 (60), and Y-capacitors Cy1 (81a), Cy2 (81b), Cy3 (82a) and Cy4 (82b) are connected in respective lines through electric wires and metal terminals as shown in FIG. 6. As shown in FIG. 6, the X-capacitors 50 and 60 are connected to respective input terminals and output terminals. Further, one of the terminals of each of the Y-capacitors 81a, 81b, 82a and 82b is connected to a respective line and the other terminals are connected to the ground terminals 13.

Figure 7:
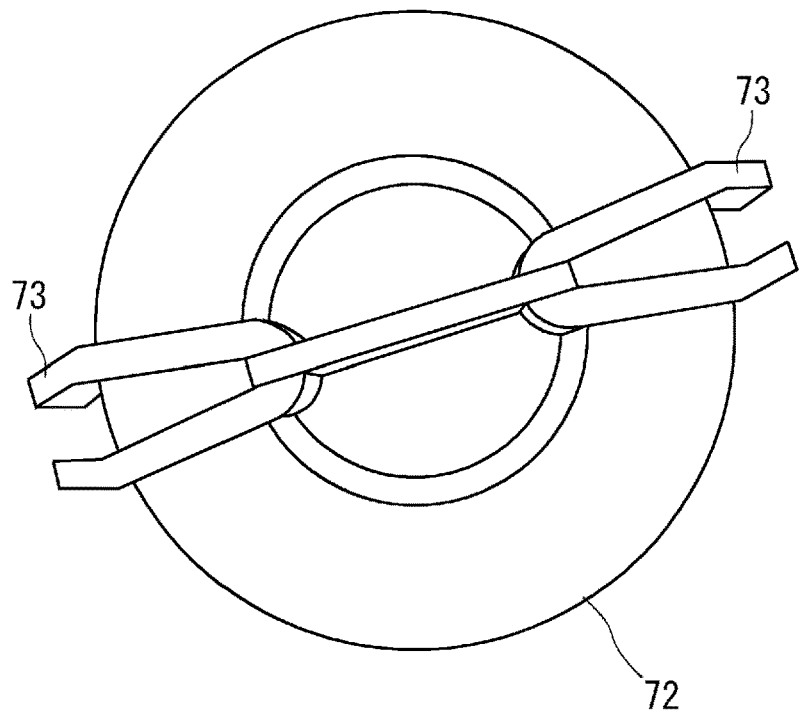
FIG. 7 is a bottom view showing an example of a core case in the inductor shown in FIG. 4.
Figure 8:
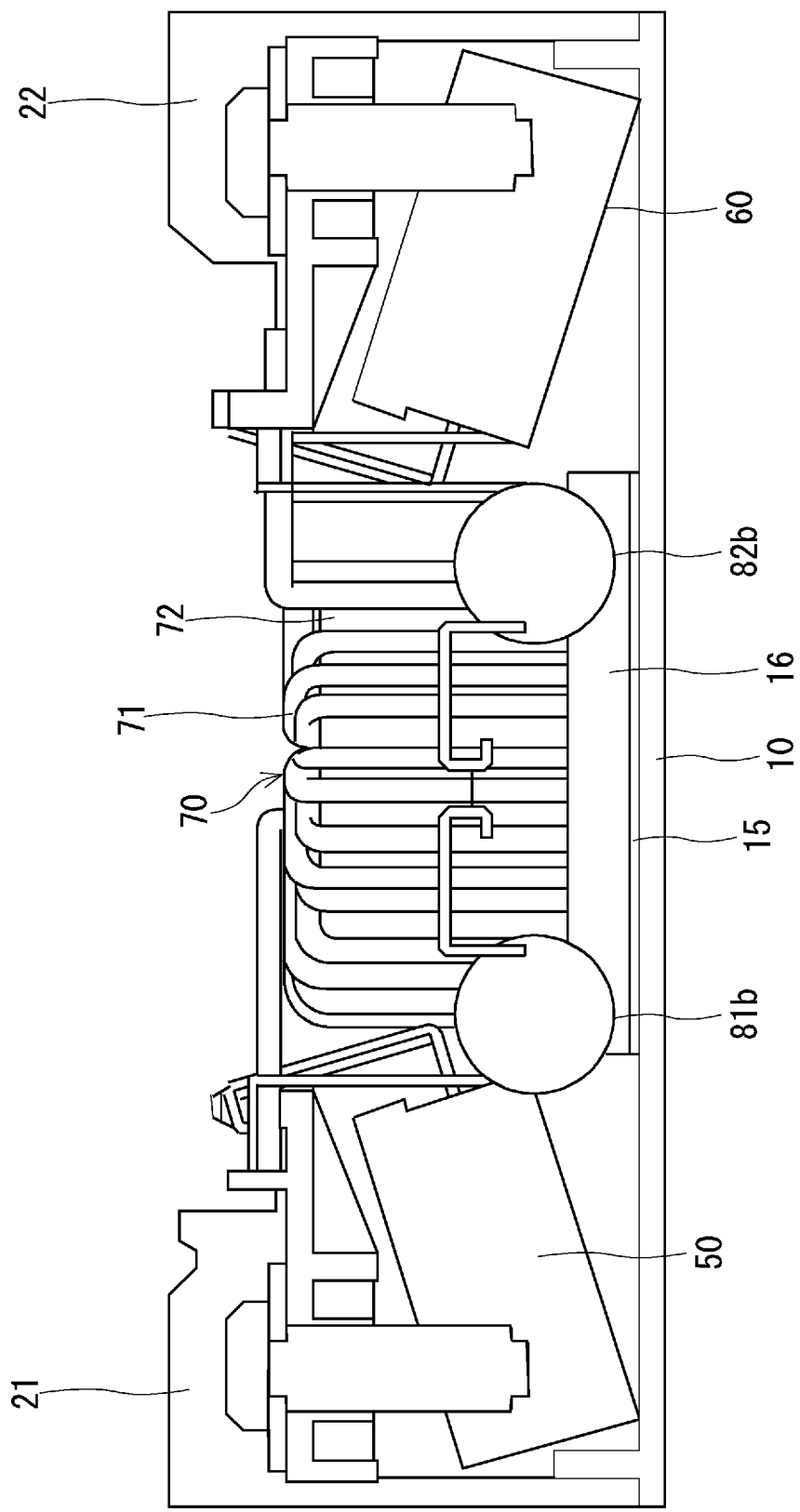
FIG. 8 is a transparent view as viewed in a VII-VII direction in FIG. 5.

Next, the inductor 70 and its arrangement are described with reference to FIGS. 7 and 8. FIG. 7 is a bottom view showing an example of a core case 72 in the inductor 70 shown in FIGS. 4 and 5. FIG. 8 is a transparent view as viewed in a VII-VII direction in FIG. 5. However, as shown in FIG. 5, the left and right ends of the VII-VII direction are positioned at vertically different positions. That is, the plane on which the interior of the case main body is made visible is a step-like plane. More specifically, it is considered that FIG. 8 is a transparent view showing a state in which a side wall 33 on the bottom side of the case main body 20 shown in FIG. 5 is made transparent.

The inductor 70 may include a core case 72 which houses a core and around which an electric wire is wound. The core case 72 may have an external shape with an annular surface such as a doughnut-shape as shown in FIG. 7, and may be made of resin.

In particular, the core case 72 preferably includes a positioning part 73 that positions the inductor 70 with respect to the case main body 20. The positioning part 73 may have any shape. However, the positioning part 73 is preferably able to determine at least the orientation of the inductor 70 in the horizontal direction as shown in FIG. 7. Further, the case main body 20 can include a case-side positioning part 30 having a shape by which it is engaged with the positioning part 73 as shown in FIG. 3.

By engaging the positioning part 73 with the case-side positioning part 30, it is possible to position a release position, i.e., a position at which the wingding 71 is separated from the core case 72 (a position at which the winding 71 is no longer in contact with the core case 72), with respect to the terminal strip 21 (i.e., to position the release position with respect to the metal plate 21c or 21d). That is, by engaging the positioning part 73 with the case-side positioning part 30, it is possible to determine the direction in which the two input-side terminals of the inductor 70 face the metal plates 21c and 21d, respectively, of the terminal strip 21. In other words, it is possible to determine the direction in which the two lead wires on the input side extend. That is, it is possible to easily align the positions of the two input-side terminals of the inductor 70 with the positions of the metal plates 21c and 21d, respectively, of the terminal strip 21. Similarly, by using the above-described way of engaging, it is possible to determine the direction in which the two output-side terminals of the inductor 70 face the metal plates 22c and 22d, respectively, of the terminal strip 22.

By making it possible to determine the orientation of the inductor 70 in the horizontal direction as described above, an operator who mounts the inductor 70 on the case main body 20 (who performs assembling work) can easily determine the direction in which the winding 71 extends from the core case 72. That is, by making it possible to determine the position, it is possible to easily perform the assembling work even when the workability of the assembling work deteriorates due to the downsizing of the noise filter 1. Therefore, it is possible to downsize the noise filter 1. As a result, it is possible to uniformly maintain the insulation distance between the terminal of the inductor 70 and the bottom plate 10 or the like, which affects the characteristics of the noise filter. That is, it is possible to make the characteristics of noise filters as products uniform and also improve the safety.

In particular, the positioning part 73 preferably positions the inductor 70 with respect to the bottom plate 10 in the height direction. The positioning in the height direction can be easily determined by adjusting the thickness of the case-side positioning part 30 in the vertical direction and by the height of the projection of the positioning part 73 in the vertical direction. As compared to the case where the positioning in the height direction is dependent on the amount and the like of a later-described heat dissipation material 16, it is possible to make the height of the inductor 70 uniform in the assembling work. Therefore, it is possible to make the characteristics of noise filters as products uniform and also improve the safety. Further, when the noise filter includes a later-described heat dissipation hole 27, it is possible to make the distance between the bottom surface of the inductor 70 (i.e., a surface opposed to the bottom plate 10) and the bottom plate 10 uniform. In this way, it is possible to reliably maintain the insulation distance between the winding 71 of the inductor 70 and the bottom plate 10 or the like, which affects the characteristics of the noise filter. That is, it is possible to make the characteristics of noise filters as products uniform and also improve the safety.

Further, as shown in FIG. 3, the case main body 20 may include a heat dissipation hole 27 in at least a part of an area where the inductor 70 is disposed. The heat dissipation hole 27 is a hole for dissipating heat generated in the inductor 70 to the bottom plate 10 side and is formed as a hollow part. By improving the heat dissipation efficiency, it becomes possible to reduce the frequency band and the like for which there has been an upper limit for the characteristics of the noise filter due to the generation of heat in the inductor 70 (or to increase the upper limit), and thereby to improve the characteristics of the noise filter. Needless to say, although the main purpose of the heat dissipation hole 27 is to cope with the heat generated by the inductor 70, it can also cope with heat generated by other circuits disposed inside the case main body 20. Further, by adopting the structure capable of improving the heat dissipation efficiency as described above, the number of winding of the winding 71 (i.e., the number of times the winding 71 is wound around the inductor 70) can be increased as compared to the case where the above-described structure is not adopted. Therefore, it is considered that the characteristics of the noise filter can be improved.

Further, the heat dissipation material 16 is preferably applied to at least a part of the bottom surface side of the inductor 70 (a part including the heat dissipation hole 27). That is, the heat dissipation material 16 is applied to the lower part of the inductor 70. For example, a mixed material of silicone and a heat conductive material can be used as the heat dissipation material 16. However, any material having a high thermal conductivity can be used. Further, the heat dissipation material 16 is preferably a material that solidifies over time after being applied. By applying the heat dissipation material 16, it is possible to dissipate heat to the bottom plate 10 more efficiently. That is, it is possible to improve the thermal conductive efficiency (the heat dissipation efficiency).

The difference in the heat dissipation efficiency in regard to the presence/absence of the heat dissipation material 16 was examined, it was confirmed that the heat dissipation efficiency could be actually improved. Therefore, there is no need to form the entire surface of the case (the housing) of the noise filter 1 by a metal material. That is, as described above with reference to FIG. 1 and the like, only the bottom plate 10 of the noise filter 1 may be formed of a metal material, instead of forming the entire surface of the case thereof by a metal material.

Further, as shown in FIG. 8, it is possible to provide, in the noise filter 1, an insulating sheet 15 such insulating paper or the like disposed in the part of the bottom plate 10 corresponding to the area to which the heat dissipation material 16 is applied. That is, it is possible to dispose (interpose) the insulating sheet 15 between the bottom plate 10 and the dissipation material 16 in the noise filter 1. Further, the insulating sheet 15 may be disposed in such a manner that helix-shaped parts (not shown) are formed on both sides of the insulating sheet 15 and the ground terminal 13 passes through the helix-shaped parts, so that the movement of the insulating sheet 15 in the horizontal direction is restricted.

As described above, it is possible to ensure the insulation between the inductor 70 and the bottom plate 10 by interposing the insulating sheet 15 therebetween, and to improve the heat dissipation efficiency by applying the heat dissipation material 16 to the insulating sheet 15 from above thereof.

Figure 9:
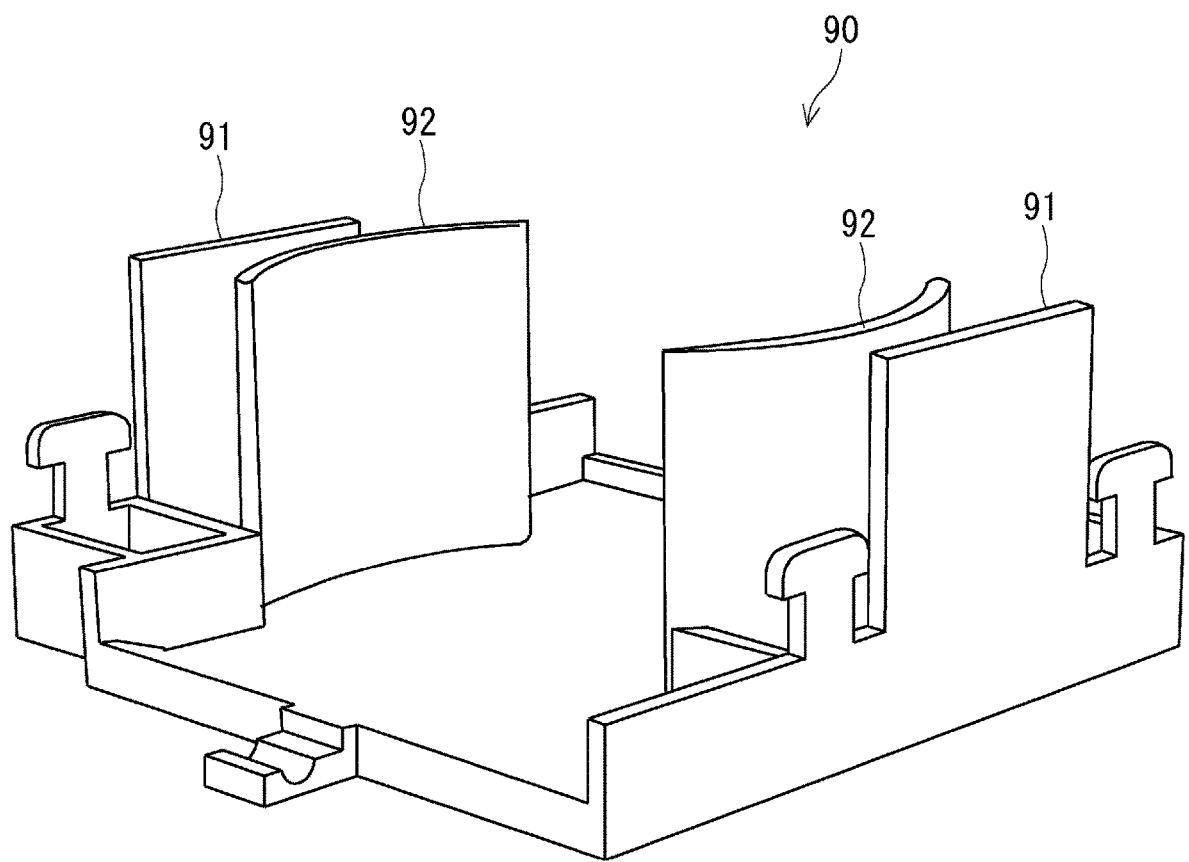
FIG. 9 is a perspective view showing an upside-down state of the top cover of the noise filter shown in FIG. 1.
Figure 10:
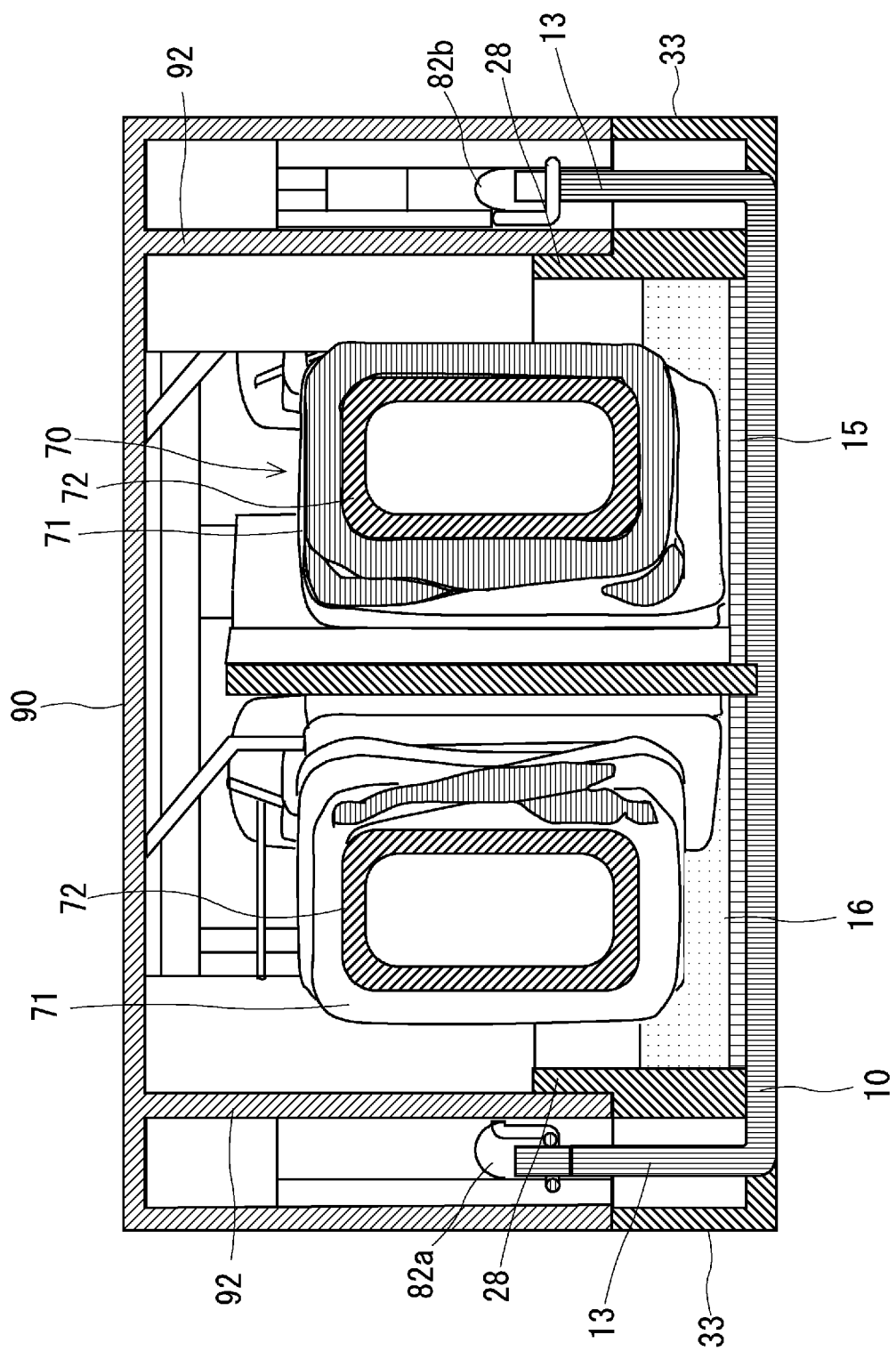
FIG. 10 is a cross section of the noise filter shown in FIG. 1 as viewed in a IX-IX direction in FIG. 5.

Next, an insulating structure of the inductor 70 by using the case cover 90 is described with reference to FIGS. 9 and 10. FIG. 9 is a perspective view showing an upside down state of the case cover 90. FIG. 10 is a cross section of the noise filter 1 and shows a cross section of the insulating structure of the inductor 70. FIG. 10 is a cross section of the noise filter 1 shown in FIG. 1 as viewed in a IX-IX direction in FIG. 5.

As shown in FIG. 9, the case cover 90 may include an insulating partition part 92. Meanwhile, as shown in FIGS. 3 and 10, the case main body 20 may include, as a side wall of the heat dissipation hole 27, an insulating partition part 28 having a shape by which it can be engaged with the insulating partition part 92. Each of the insulating partition parts 28 and 92 may have a shape slightly larger than the external size of the inductor 70.

Further, as shown in FIG. 10, by attaching the case cover 90 to the case main body 20 so that the insulating partition parts 28 and 92 are engaged with each other, a physical wall is formed between the inductor 70 and the ground terminal 13, thus making it possible to ensure the insulation between these components. Note that the insulating partition part 92 may be omitted by increasing the height of the insulating partition part 28.

Figure 11:
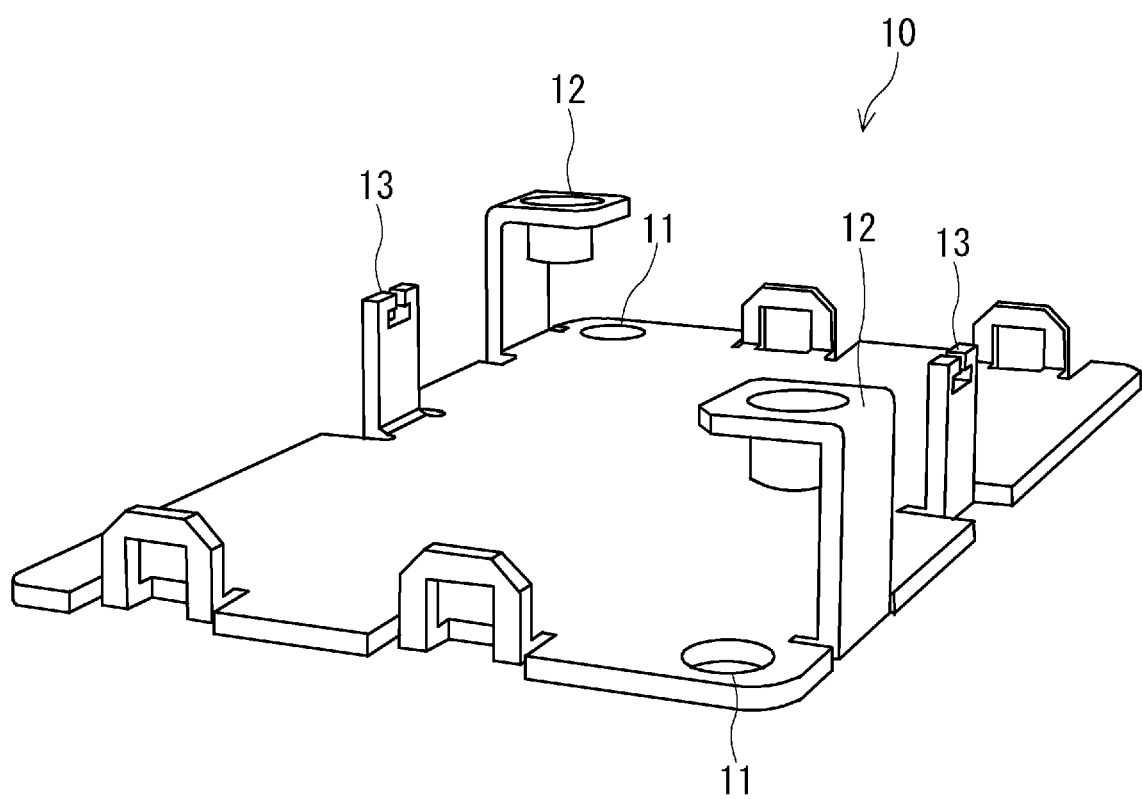
FIG. 11 is a perspective view of a bottom plate in the noise filter shown in FIG. 1.

Next, an example of the bottom plate 10 is described with reference to FIG. 11 as well as the other drawings. FIG. 11 is a perspective view of the bottom plate 10 in the noise filter 1. As shown in FIG. 11, the bottom plate 10 may be integrally formed with a pair of ground terminals 13. One of the pair of ground terminals 13 is a terminal that is connected to the Y-capacitors 81a and 82a, and the other ground terminal 13 is a terminal that is connected to the Y-capacitors 81b and 82b.

In particular, the bottom plate 10 may include a pair of attaching parts 11 arranged on one diagonal line of the bottom plate 10 for attaching (mounting) the noise filter 1 to other devices, other components, etc. By arranging the pair of attaching parts 11 on only one diagonal line, instead of arranging them on both diagonal lines, the noise filter 1 can be downsized. Note that the bottom plate 10 may include a pair of attaching parts 12 for attaching ground lines.

Further, due to the pair of attaching parts 11 arranged as described above, the terminal strips 21 and 22, in which the X-capacitors 50 and 60 are respectively housed, differ between the input side and the output side as shown in FIGS.

3 to 5. That is, they are diagonally arranged. That is, the terminal strips 21 and 22 are diagonally arranged. In general, it is desirable that components from the input terminal to the output terminal of a noise filter be arranged in a straight line. In this embodiment, since the components from the input terminal to the output terminal are diagonally arranged with the inductor 70 being the center in order to downsize the noise filter, the inductor 70 also needs to be positioned in parallel to this diagonal line. By diagonally arranging the case-side positioning part 30 as well as the inductor 70, it is possible to secure the long insulation distance between the terminal of the inductor 70 connected to the metal plate 21c and the terminal thereof connected to the metal plate 21d, and to secure the long insulation distance between the terminal of the inductor 70 connected to the metal plate 22c and the terminal thereof connected to the metal plate 22d.

Next, how to select materials and the like for the bottom plate 10 and for the core of the inductor 70 is described with reference to FIGS. 12A to 12E. FIGS. 12A to 12E are graphs showing results of simulations in which a normal-mode inductance Ln in the noise filter 1 shown in FIG. 1 was calculated. FIGS. 12A to 12E show results of calculation of the normal mode inductance Ln in which the type of the material of the core, the number of winding of the coil, the type of the material of the bottom plate, etc. were changed.

Note that the noise filter 1 shown in FIGS. 1 to 11 was used in the calculation. Note that the case main body 20 and the case cover 90 were made of plastic. Further, in the calculation, as an example of the inductor 70, an inductor I in which two windings (i.e., two wires) 71 each having a diameter of 1.4 mm were used and the number of winding of each coil was 7 T (which is assumed to correspond to a product having a rated current of 30 A) was used. Further, in the calculation, as another example, an inductor II in which one winding (i.e., one wire) 71 having a diameter of 1.0 mm was used and the number of winding of the coil was 25 T (which is assumed to correspond to a product having a rated current of 6 A) was used.

Further, in the calculation, as a material of the core in the core case 72, two types of materials, i.e., nanocrystal and ferrite were used. Further, a toroidal core having an external size of 21.5 mm, an inner diameter of 14.5 mm, and a height of 10 mm was used. Further, in the calculation, two types of plates, i.e., an iron plate (having a magnetic permeability μ of 150 H/m and a maximum frequency of 1 kHz), which was an example of a ferromagnet, and an aluminum plate, which was an example of a non-magnetic conductor, were used as the bottom plate 10. Further, both of them had a thickness of 1.2 mm. Further, as the insulating sheet 15, four types of sheets having a thickness of 0.1 mm, 0.5 mm, 1.0 mm and 2.0 mm, respectively, were used. Further, no heat dissipation material 16 was used. Further, for a comparison purpose, calculation was also carried out for a case where a plastic plate, which was an example of a non-magnetic insulator, was used for the metallic bottom plate 10 and no insulating sheet 15 was used. Note that in FIGS. 12A to 12E "NONE" means a case where the plastic plate was used for the bottom plate 10 and no insulating sheet 15 was used.

Figure 12A:
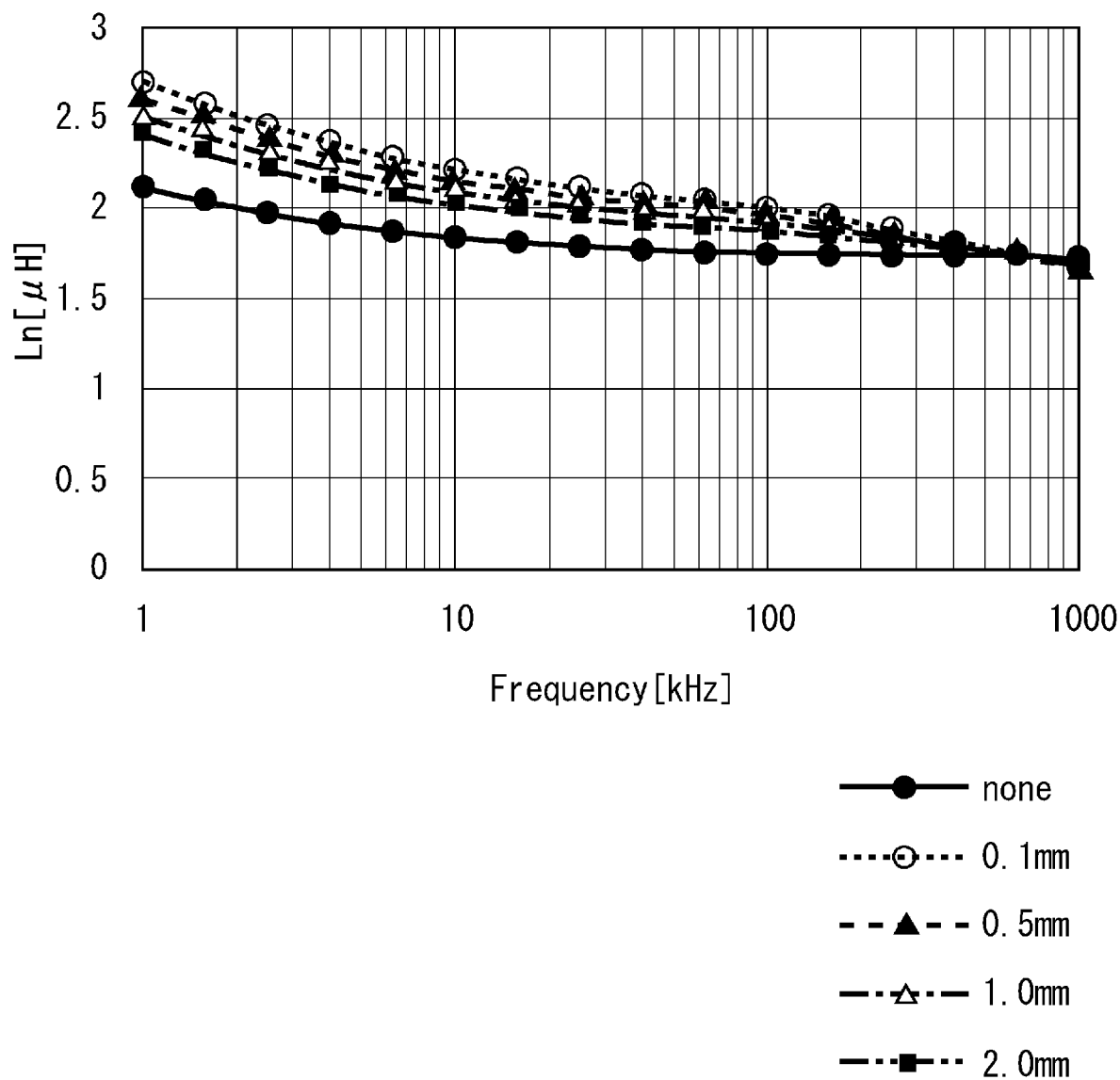
FIG. 12A is a graph showing a result of a simulation in which a normal-mode inductance in the noise filter shown in FIG. 1 is calculated.

FIG. 12A is a graph showing a result of a simulation of the normal-mode inductance Ln [μH] in which: a nanocrystal core was used in the inductor I; an iron plate was used for the bottom plate 10; and the thickness of the insulating sheet 15 was changed. In the result shown in FIG. 12A, roughly speaking, the normal-mode inductance Ln changed as follows. That is, the normal-mode inductance Ln becomes larger as the frequency becomes smaller. The normal-mode inductance Ln was minimized when the non-magnetic insulator was used for the bottom plate 10. Further, the normal-mode inductance Ln becomes larger as the thickness of the insulating sheet 15 becomes smaller.

Figure 12B:
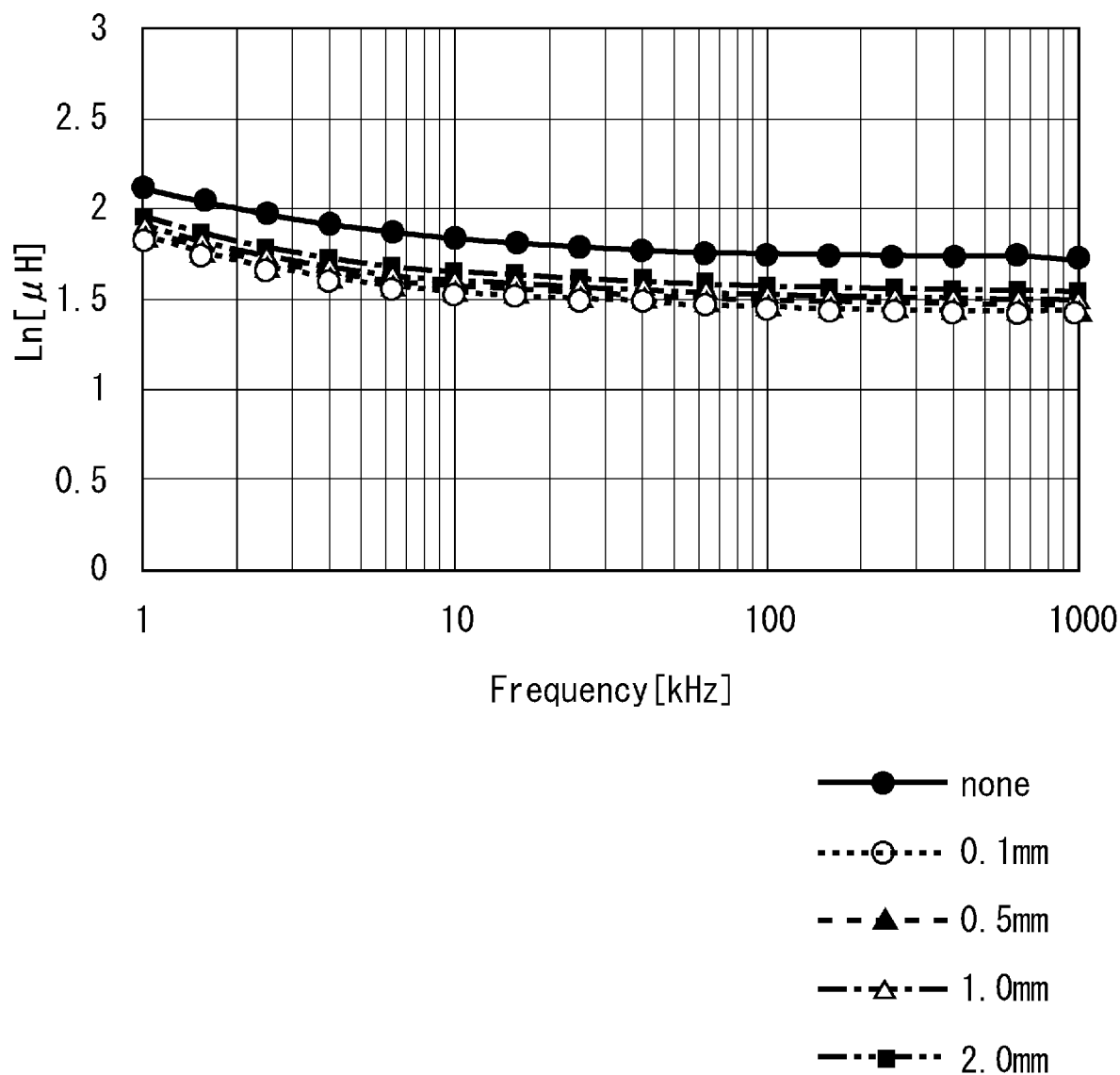
FIG. 12B is a graph showing a result of a simulation in which a normal-mode inductance in the noise filter shown in FIG. 1 is calculated.

FIG. 12B is a graph showing a result of a simulation of the normal-mode inductance Ln [μH] in which: a nanocrystal core was used in the inductor I; an aluminum plate was used for the bottom plate 10; and the thickness of the insulating sheet 15 was changed. The result shown in FIG. 12B was obtained by changing the bottom plate 10 from the iron plate to the aluminum plate in the case shown in FIG. 12A. Roughly speaking, the normal-mode inductance Ln changed as follows. That is, the normal-mode inductance Ln becomes larger as the frequency becomes smaller as in the case of the result shown in FIG. 12A. However, in contrast to the result shown in FIG. 12A, the normal-mode inductance Ln was maximized when the non-magnetic insulator was used for the bottom plate 10. Further, the normal-mode inductance Ln becomes smaller as the thickness of the insulating sheet 15 becomes smaller. Further, in FIG. 12B, the effect on the normal-mode inductance Ln at high frequencies is small as compared to the result shown in FIG. 12A.

Figure 12C:
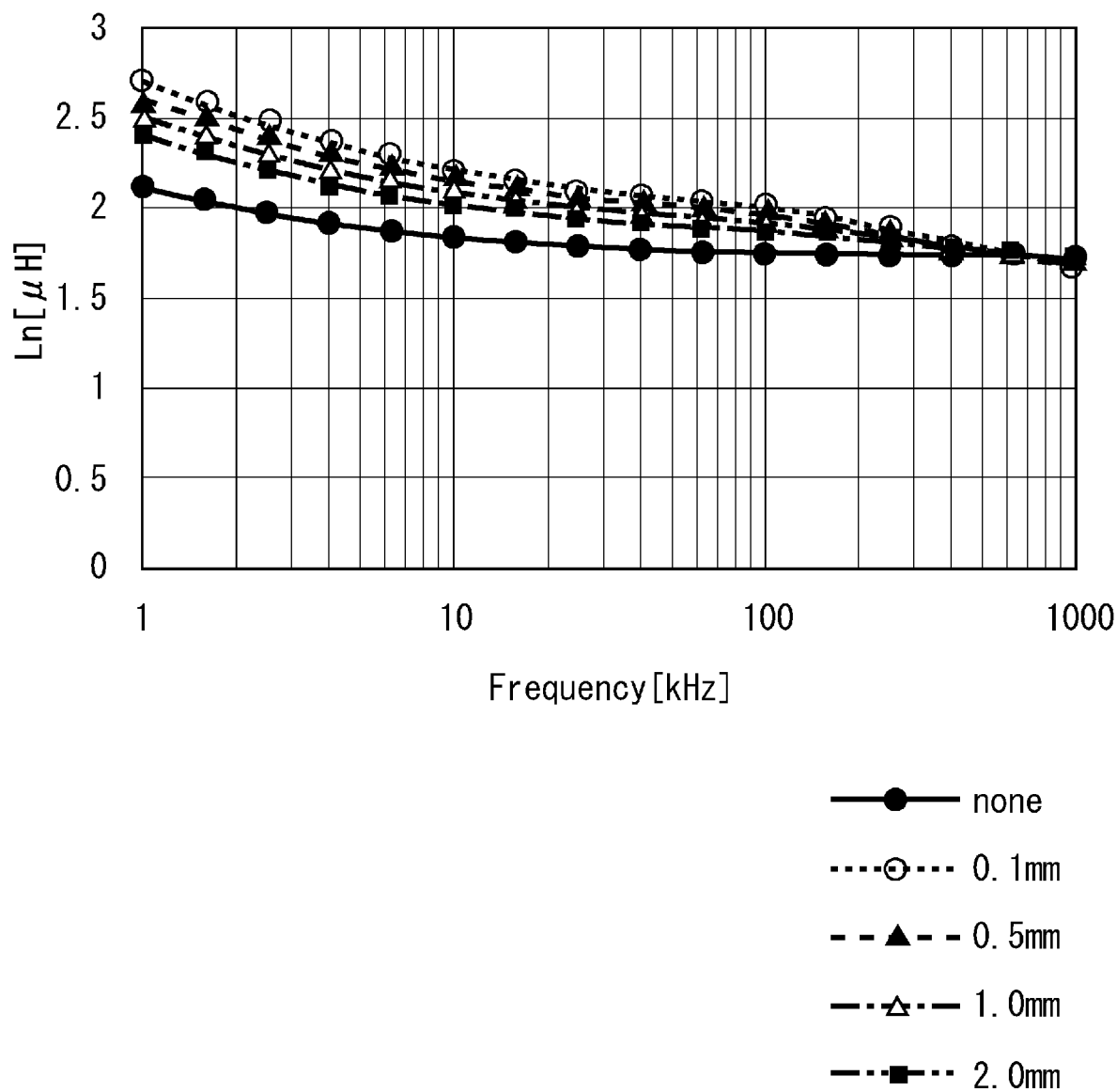
FIG. 12C is a graph showing a result of a simulation in which a normal-mode inductance in the noise filter shown in FIG. 1 is calculated.

FIG. 12C is a graph showing a result of a simulation of the normal-mode inductance Ln [μH] in which: a ferrite core was used in the inductor I; an iron plate was used for the bottom plate 10; and the thickness of the insulating sheet 15 was changed. The result shown in FIG. 12C was obtained by changing the core from the nanocrystal to the ferrite in FIG. 12A. Roughly speaking, the normal-mode inductance Ln has tendencies similar to those shown in FIG. 12A.

Figure 12D:
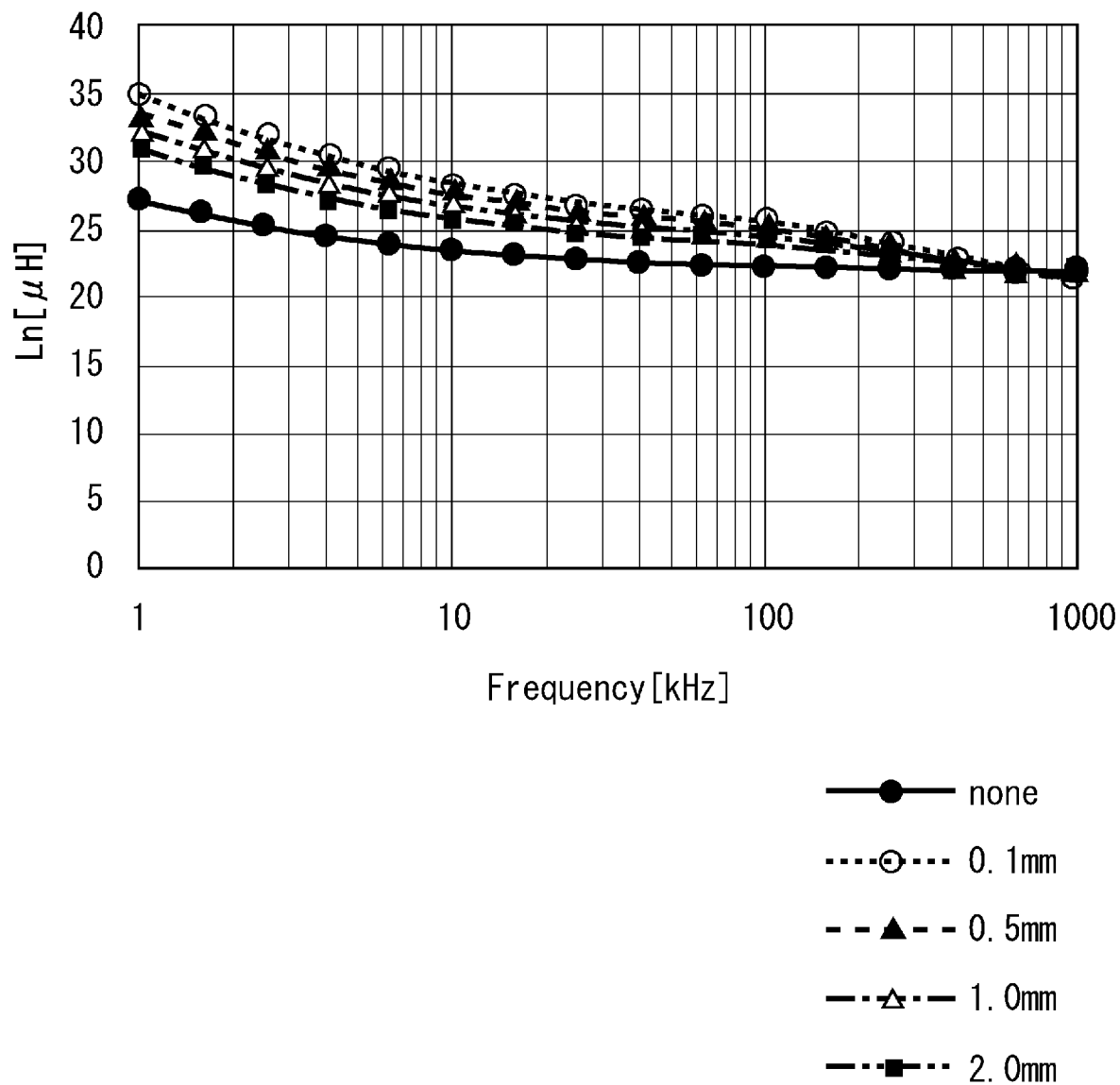
FIG. 12D is a graph showing a result of a simulation in which a normal-mode inductance in the noise filter shown in FIG. 1 is calculated.

FIG. 12D is a graph showing a result of a simulation of the normal-mode inductance Ln [μH] in which: a nanocrystal core was used in the inductor II; an iron plate was used for the bottom plate 10; and the thickness of the insulating sheet 15 was changed. The result shown in FIG. 12D was obtained by increasing the number of winding of the winding 71 in the case shown in FIG. 12A. Roughly speaking, the normal-mode inductance Ln changed as follows. That is, the tendencies in regard to the frequency, the thickness of the insulating sheet 15, etc. were similar to those shown in FIG. 12A. However, the value of the normal-mode inductance Ln itself was larger roughly one order of magnitude as compared to the case shown in FIG. 12A.

Figure 12E:
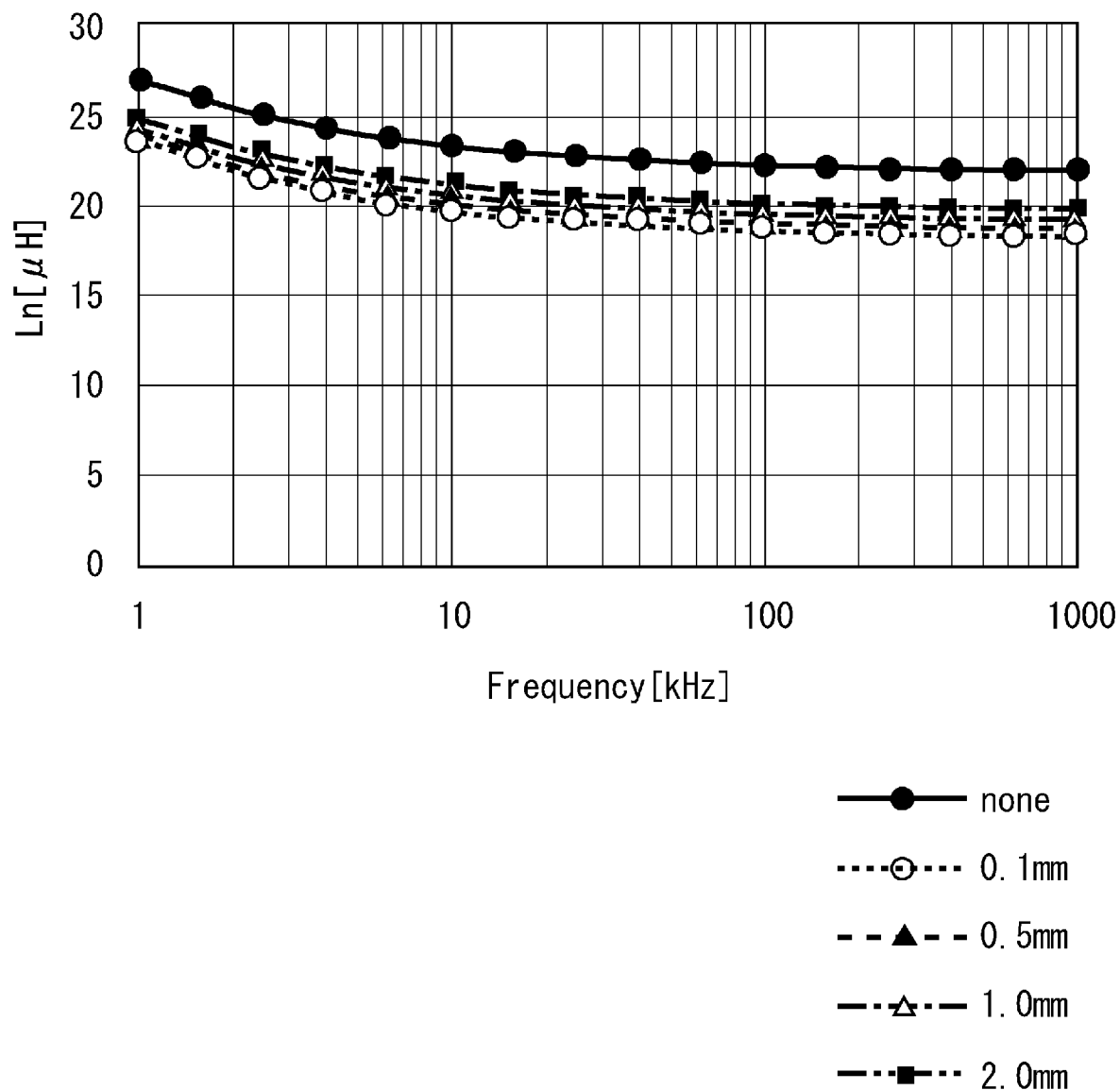
FIG. 12E is a graph showing a result of a simulation in which a normal-mode inductance in the noise filter shown in FIG. 1 is calculated.

FIG. 12E is a graph showing a result of a simulation of the normal-mode inductance Ln [μH] in which: a nanocrystal core was used in the inductor II; an aluminum plate was used for the bottom plate 10; and the thickness of the insulating sheet 15 was changed. The result shown in FIG. 12E was obtained by increasing the number of winding of the winding 71 in the case shown in FIG. 12B. Roughly speaking, the normal-mode inductance Ln changed as follows. That is, the tendencies in regard to the frequency, the thickness of the insulating sheet 15, etc. were similar to those shown in FIG. 12B. However, the value of the normal-mode inductance Ln itself was larger roughly one order of magnitude as compared to the case shown in FIG. 12B.

Firstly, based on the results shown in FIGS. 12A to 12E, it has been found that the normal mode inductance Ln changes as the distance between the inductor 70 and the bottom plate 10 is changed.

Further, from the comparison between FIGS. 12A and 12B, it has been found that how the normal-mode inductance Ln changes differs between when the material of the bottom plate 10 is a ferromagnet and when the material is a non-magnetic conductor. In particular, it has been found that when the bottom plate 10 is an iron plate, which is a ferromagnet, the normal-mode inductance Ln becomes larger as the thickness of the insulating sheet 15 becomes smaller, i.e., the distance between the inductor 70 and the bottom plate 10 becomes shorter. Meanwhile, when the bottom plate 10 is an aluminum plate, which is a non-magnetic conductor, the normal-mode inductance Ln becomes smaller as the distance between the inductor 70 and the bottom plate 10 becomes shorter. It should be noted that, though not shown in the drawings, a simulation was also carried out in a case where the iron plate was changed to an aluminum plate in the case shown in FIG. 12C, and the same tendencies were observed. It is presumed that this is because when the bottom plate 10 is a ferromagnet, the normal-mode inductance Ln becomes larger due to the magnetic permeability, and when the metallic bottom plate 10 is a non-magnetic conductor, the normal-mode inductance Ln becomes smaller due to the eddy current.

Further, from the comparison between FIGS. 12A and 12B and the comparison between FIGS. 12D and 12E, it has been found that the influence of the material of the bottom plate 10 becomes larger as the insulating sheet 15 becomes thinner, and becomes larger as the distance between the inductor 70 and the bottom plate 10 becomes shorter. It should be noted that simulations were also carried out in a case where the iron plate was changed to an aluminum plate in the case shown in FIG. 12C and in a case where the material of the core was changed from the nanocrystal to ferrite in the case shown in FIGS. 12D and 12E, and the same tendencies were observed.

Further, from these results, it has been found that when the bottom plate 10 is a ferromagnet, the normal-mode inductance Ln became larger as the distance between the inductor 70 and the bottom plate 10 becomes shorter (as the thickness of the insulating sheet 15 became smaller) due to the magnetic permeability. At the same time, it has been found that when the bottom plate 10 is a non-magnetic conductor, the normal-mode inductance Ln became smaller as the distance between the inductor 70 and the bottom plate 10 became smaller due to the eddy current.

As described above, it is possible to adjust the normal-mode inductance Ln by changing the material of the bottom plate 10 and the distance between the inductor 70 and the bottom plate 10, and thereby to adjust the performance (the characteristics) of the noise filter 1. Therefore, it is possible to easily manufacture and distribute various products having different performances as noise filters 1 in which only the aforementioned distance is changed.

Accordingly, as described above, the bottom plate 10 may be made of a ferromagnet (including a ferrimagnet or a ferromagnet in the narrow sense). Further, as described above, the bottom plate 10 may be made of a non-magnetic conductor. In any case, it is possible to adjust the normal mode inductance Ln by changing the distance between the inductor 70 and the bottom plate 10. Note that when the bottom plate 10 is made of a strong material such as an iron plate, its thickness can be reduced. Further, when the metallic bottom plate 10 is made of a material having a moderate strength such as an aluminum plate, a plate having a relatively large thickness may be used.

Further, an iron plate was used for the bottom plate 10 in FIGS. 12A, 12C and 12D. In each of these examples, the result becomes closer to the characteristics in the case where no bottom plate 10 is used as the frequency becomes higher. It is presumed that these results were obtained because the value $\mu$ approaches one ($\mu$=1) because of the $\mu$-f characteristic of the iron plate.

Note that from the comparison between FIGS. 12A and 12C, it has been found that there is no difference in the adjustment of the normal mode inductance Ln even when the material of the core is changed. Further, although not shown in the drawings, simulations were also carried out while the core was changed to a ferrite core in the cases shown in FIGS. 12B, 12D and 12E. As a result, it has been found that, though not shown in the drawings, the material of the core does not affect the adjustment of the normal mode inductance Ln as in the case of FIGS. 12A and 12C.

The noise filter 1 according to this embodiment has been described above. There are no limitations on the shape, the size, etc. of each component of the noise filter 1 as long as the component can provide its function. Further, the various examples described in this embodiment may be combined as appropriate with one another.

OTHER EMBODIMENTS

A noise filter according to other embodiments of the present disclosure includes, as essential components, the following components used in the noise filter according to the above-described embodiment, and may not include other components.

That is, the noise filter according to this embodiment includes the metallic bottom plate 10, the case main body 20 which is integrally formed with the terminal strips 21 and 22, and attached to the metallic bottom plate 10, and the inductor 70 which is disposed on the top surface side of the case main body 20 and includes terminals configured to be connected in the terminal strips 21 and 22. Further, the inductor 70 includes the core case 72 which houses a core and around which an electric wire (the winding 71) is wound. Further, the core case 72 includes the positioning part 73 that positions the inductor 70 with respect to the case main body 20. Further, the case main body 20 includes the case-side positioning part 30 having a shape by which it is engaged with the positioning part 73. Further, the positioning part 73 positions, as it is engaged with the case-side positioning part 30, a release position, i.e., a position at which the wound electric wire is separated from the core case 72, with respect to the terminal strips 21 and 22 and positions the inductor 70 with respect to the bottom plate 10 in a height direction.

According to this embodiment, as described above with reference to FIGS. 7 and 8, it is possible to improve the characteristics of the noise filter, which are required to downsize the external size of the noise filter.

Note that in this embodiment, similarly to the previously-described embodiment, the aforementioned various examples, such as an example in which the number of terminal strips is one, can be applied. Further, there are no limitations on the shape, the size, etc. of each component as long as the component can provide its function. Further, the aforementioned various examples may also be combined as appropriate with one another in this embodiment.

The above-mentioned embodiments may be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. A noise filter comprising:
   a metallic bottom plate;
   a case main body integrally formed with a terminal strip and attached to the bottom plate;

a capacitor comprising a terminal configured to be connected in the terminal strip;
a capacitor housing part formed inside the terminal strip in the case main body, the capacitor housing part being configured to house the capacitor; and
an inductor disposed on a top surface side of the case main body, the inductor comprising a terminal configured to be connected in the terminal strip, wherein
the capacitor housing part houses the capacitor in a state where the capacitor is inclined with respect to the bottom plate so that a lead part of the terminal of the capacitor is positioned on an upper end side of the capacitor in an inclination direction.

2. The noise filter according to claim 1, wherein the capacitor housing part has such a shape that the capacitor can be insertion-fitted into the capacitor housing part in a direction oblique to the bottom plate in a state where the bottom plate is attached to the case main body and the inductor is not disposed on the top surface side of the case main body.

3. The noise filter according to claim 2, wherein the capacitor housing part includes an inclined part configured to guide a top surface of the capacitor located on a side extending along an insertion-fitting direction when the capacitor is insertion-fitted.

4. The noise filter according to claim 3, wherein the capacitor housing part houses the capacitor in a state where the capacitor is in contact with a part of the inclined part.

5. The noise filter according to claim 2, wherein the capacitor housing part includes a pressing part configured to press a bottom surface of the capacitor located on a side extending along the inclination direction in a state where the capacitor is housed in the capacitor housing part.

6. The noise filter according to claim 1, wherein the capacitor includes an exterior case made of resin.

7. The noise filter according to claim 1, wherein the capacitor is an X-capacitor.

8. The noise filter according to claim 1, wherein
the terminal strip includes an input terminal strip and an output terminal strip, and
the capacitor comprises an input-side capacitor configured to be connected in the input terminal strip and an output-side capacitor configured to be connected in the output terminal strip.

9. The noise filter according to claim 8, wherein the bottom plate comprises a pair of attaching parts configured to be attached to the noise filter, the pair of attaching parts being arranged on one diagonal line.

10. The noise filter according to claim 1, wherein
the inductor comprises a core case configured to house a core, the core case being configured so that an electric wire is wound around the core case, and
the core case comprises a positioning part configured to position the inductor with respect to the case main body.

11. The noise filter according to claim 10, wherein
the case main body comprises a case-side positioning part having a shape by which the case-side positioning part is engaged with the positioning part, and
the positioning part positions, as the positioning part is engaged with the case-side positioning part, a release position with respect to the terminal strip, the release position being a position at which the wound electric wire is separated from the core case.

12. The noise filter according to claim 10, wherein the positioning part positions the inductor with respect to the bottom plate in a height direction.

13. The noise filter according to claim 10, wherein the bottom plate is a ferromagnet.

14. The noise filter according to claim 10, wherein the bottom plate is a non-magnetic conductor.

15. The noise filter according to claim 1, further comprising:
a Y-capacitor of which one of two terminals of the Y-capacitor is connected to the bottom plate and the other terminal is connected to the terminal strip; and
a case cover attached to the case main body so as to cover at least the inductor, wherein
the case main body comprises a cut-out part on a part of a side surface thereof, the cut-out part being configured to form a work space that is used when the one of the two terminals and the other terminal are connected to the bottom plate and the terminal strip respectively in a state where the case cover is removed.

16. A noise filter comprising:
a metallic bottom plate;
a case main body integrally formed with a terminal strip and attached to the bottom plate; and
an inductor disposed on a top surface side of the case main body, the inductor comprising a terminal configured to be connected in the terminal strip, wherein
the inductor comprises a core case configured to house a core, the core case being configured so that an electric wire is wound around the core case,
the core case comprises a positioning part configured to position the inductor with respect to the case main body,
the case main body comprises a case-side positioning part having a shape by which the case-side positioning part is engaged with the positioning part, and
the positioning part positions, as the positioning part is engaged with the case-side positioning part, a release position with respect to the terminal strip and positions the inductor with respect to the bottom plate in a height direction, the release position being a position at which the wound electric wire is separated from the core case.

* * * * *